(12) United States Patent
Lee et al.

(10) Patent No.: US 12,213,322 B2
(45) Date of Patent: Jan. 28, 2025

(54) SEMICONDUCTOR MEMORY DEVICE COMPRISING MAGNETIC TUNNEL JUNCTIONS

(71) Applicant: Samsung Electronics Co., Ltd., Suwon-si (KR)

(72) Inventors: Kyung Hwan Lee, Seoul (KR); Kwang Seok Kim, Seoul (KR); Yong Seok Kim, Suwon-si (KR); Il Gweon Kim, Hwaseong-si (KR); Kil Ho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 739 days.

(21) Appl. No.: 17/380,331

(22) Filed: Jul. 20, 2021

(65) Prior Publication Data

US 2022/0157887 A1 May 19, 2022

(30) Foreign Application Priority Data

Nov. 19, 2020 (KR) .................. 10-2020-0155062

(51) Int. Cl.
*H10B 61/00* (2023.01)
*G11C 11/16* (2006.01)

(52) U.S. Cl.
CPC ............ *H10B 61/22* (2023.02); *G11C 11/161* (2013.01); *G11C 11/1659* (2013.01); *G11C 11/1673* (2013.01); *G11C 11/1675* (2013.01)

(58) Field of Classification Search
CPC .............................. H10B 61/22; G11C 11/161
See application file for complete search history.

(56) References Cited

U.S. PATENT DOCUMENTS 9,525,126 B1   12/2016  Lin
9,608,038 B2    3/2017  Wang et al.
(Continued)

FOREIGN PATENT DOCUMENTS

KR        10-1167551 B1    7/2012
KR     10-2014-0043262 A   4/2014
KR     10-2018-0046964 A   5/2018

OTHER PUBLICATIONS

Korean Office Action dated Jul. 31, 2024 issued in Korean Patent Application No. 10-2020-0155062.

*Primary Examiner* — Jami Valentine Miller
(74) *Attorney, Agent, or Firm* — Harness, Dickey & Pierce, P.L.C.

(57) ABSTRACT

A three-dimensional semiconductor memory device is provided. The semiconductor memory device includes first horizontal conductive lines on a substrate in a first direction, each of the first horizontal conductive lines extending in a second direction different from the first direction, second horizontal conductive lines stacked on the substrate in the first direction, each of the second horizontal conductive lines extending in the second direction, a vertical conductive line between the first horizontal conductive line and the second horizontal conductive line and extending in the first direction, a plurality of first magnetic tunnel junction patterns between the vertical conductive line and each of the first horizontal conductive lines, and a plurality of second magnetic tunnel junction patterns between the vertical conductive lines and each of the second horizontal conductive lines. The first horizontal conductive lines and the second horizontal conductive lines are spaced apart from each other in a third direction.

20 Claims, 29 Drawing Sheets

(56) References Cited

U.S. PATENT DOCUMENTS

| | | |
|---|---|---|
| 10,326,073 B1 | 6/2019 | Tzoufras et al. |
| 10,388,697 B2 | 8/2019 | Chen et al. |
| 10,424,728 B2 | 9/2019 | Fratin et al. |
| 10,546,996 B2 | 1/2020 | Mo et al. |
| 10,734,573 B2 | 8/2020 | Araki |
| 2019/0036013 A1* | 1/2019 | Mo ................. H10N 50/80 |
| 2019/0296221 A1* | 9/2019 | Araki ............... H01F 10/3259 |

\* cited by examiner

FIG. 14C

|    | PGM  | ERS  |
|----|------|------|
| BL | VPGM | GND  |
| SL | GND  | VERS |

|  | PGM | ERS | Read | |
| --- | --- | --- | --- | --- |
| BL | VPGM | GND | VREAD | VPGM |
| SL | GND | VPGM | | |
| RBL | | | GND | VPGM/2 |

SEMICONDUCTOR MEMORY DEVICE COMPRISING MAGNETIC TUNNEL JUNCTIONS

CROSS-REFERENCE TO RELATED APPLICATION

This application claims priority from Korean Patent Application No. 10-2020-0155062 filed on Nov. 19, 2020 in the Korean Intellectual Property Office, and all the benefits accruing therefrom under 35 U.S.C. 119, the contents of which in its entirety are herein incorporated by reference.

BACKGROUND

Some example embodiments relate to a semiconductor memory device, and more specifically, to a three-dimensional semiconductor memory device including a magnetic tunnel junction (MTJ).

In order to satisfy performance and/or low price expectations of consumers, increasing the degree of integration of semiconductor memory elements is pursued. In the case of the semiconductor memory elements, because the degree of integration is an important factor in determining the price of the product, an increased degree of integration is particularly pursued.

In the case of the conventional two-dimensional/planar semiconductor memory elements, the degree of integration is mainly determined by an area occupied by unit memory cells, and is therefore greatly affected by the level of fine pattern forming technology. However, since ultra-expensive apparatuses such as photolithography apparatuses are used miniaturization of the pattern, the degree of integration of two-dimensional semiconductor elements is increasing, but is still limited. As a result, three-dimensional semiconductor memory elements including memory cells arranged three-dimensionally have been proposed.

SUMMARY

Some example embodiments provide a three-dimensional semiconductor memory device having improved electrical characteristics and/or improved reliability.

According to an some example embodiments, there is provided a semiconductor memory device comprising a plurality of first horizontal conductive lines on a substrate and stacked in a first direction, each of the plurality of first horizontal conductive lines extending in a second direction different from the first direction, a plurality of second horizontal conductive lines on the substrate and stacked in the first direction, each of the plurality of second horizontal conductive lines extending in the second direction, a vertical conductive line between each of the plurality of first horizontal conductive lines and each of plurality of second horizontal conductive lines and extending in the first direction, a plurality of first magnetic tunnel junction patterns between the vertical conductive line and each of the plurality of first horizontal conductive lines, and a plurality of second magnetic tunnel junction patterns between the vertical conductive line and each of the second horizontal conductive lines. The plurality of first horizontal conductive lines and the respective plurality of second horizontal conductive lines corresponding to each other are apart from each other in a third direction different the first direction and the second direction.

According to some example embodiments, there is provided a semiconductor memory device comprising a plurality of first horizontal conductive lines on a substrate and stacked in a first direction, each of the plurality of first horizontal conductive lines extending in a second direction different from the first direction, a plurality of second horizontal conductive lines on the substrate and stacked in the first direction, each of the plurality of second horizontal conductive lines extending in the second direction, a plurality of third horizontal conductive lines on the substrate and stacked in the first direction, each of the plurality of third horizontal conductive lines extending in the second direction, a plurality of fourth horizontal conductive lines on the substrate and stacked in the first direction, each of the plurality of fourth horizontal conductive lines extending in the second direction, a first vertical conductive line between the plurality of first horizontal conductive lines and the plurality of second horizontal conductive lines and extending in the first direction, a second vertical conductive line between the plurality of third horizontal conductive lines and the plurality of fourth horizontal conductive lines, extending in the first direction, and spaced apart from the first vertical conductive line in a third direction different from the first direction and the second direction, a plurality of first magnetic tunnel junction patterns between the first vertical conductive line and the corresponding first horizontal conductive lines, a plurality of second magnetic tunnel junction patterns between the first vertical conductive line and the corresponding second horizontal conductive lines, a plurality of third magnetic tunnel junction patterns between the second vertical conductive line and the corresponding third horizontal conductive lines, and a plurality of fourth magnetic tunnel junction patterns between the second vertical conductive line and the corresponding fourth horizontal conductive lines.

According to some example embodiments, there is provided a semiconductor memory device comprising a peripheral circuit region on a substrate, and a cell array stacked on the substrate over or under the peripheral circuit region in a first direction. The peripheral circuit region includes a peripheral circuit configured to control the cell array. the cell array includes a plurality of first horizontal conductive lines stacked in the first direction, each of the plurality of first horizontal conductive lines extending in a second direction different from the first direction, a plurality of second horizontal conductive lines stacked in the first direction, each of the plurality of second horizontal conductive lines extending in the second direction, a vertical conductive line between the plurality of first horizontal conductive lines and the plurality of second horizontal conductive lines and extending in the first direction, a plurality of first magnetic tunnel junction patterns between the vertical conductive line and each of the plurality of first horizontal conductive lines, and a plurality of second magnetic tunnel junction patterns between the vertical conductive line and each of the plurality of second horizontal conductive lines. The plurality of first horizontal conductive lines and the plurality of second horizontal conductive lines that correspond to each other being spaced apart from each other in a third direction different the first direction and the second direction.

However, aspects of inventive concepts are not restricted to the one set forth herein. The above and other aspects of inventive concepts will become more apparent to one of ordinary skill in the art to which the present disclosure pertains by referencing the detailed description of the present disclosure given below.

BRIEF DESCRIPTION OF THE DRAWINGS

The and other aspects and features of the present disclosure will become more apparent by describing in detail some example embodiments thereof referring to the attached drawings, in which:

FIGS. 14A to 14C are diagrams for explaining the example operation of a circuit diagram shown in FIG. 13;

DETAILED DESCRIPTION OF SOME EXAMPLE EMBODIMENTS

Figure 1:
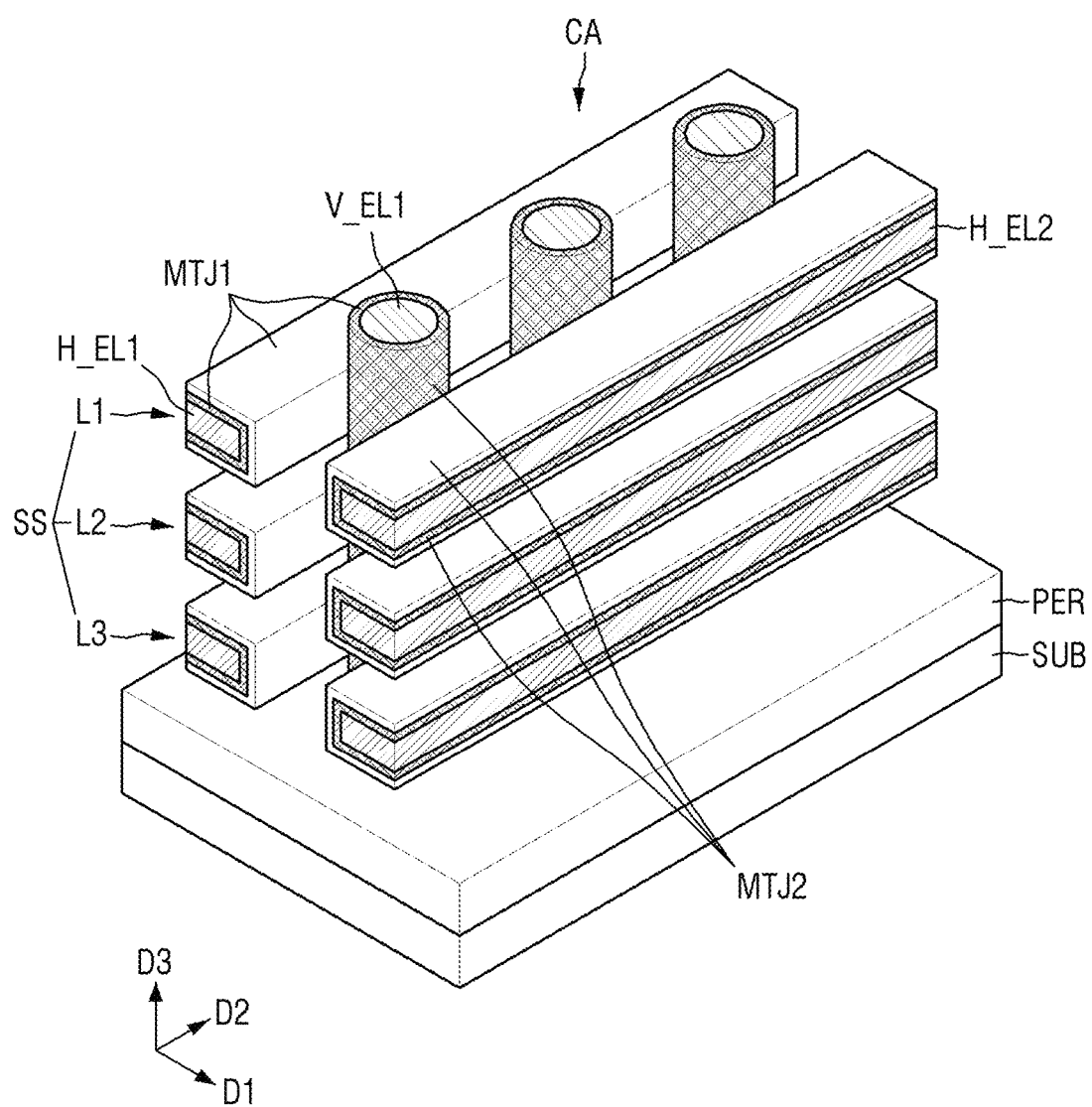
FIGS. 1 to 3 are example perspective views showing a semiconductor memory device according to some example embodiments, respectively.
Figure 2:
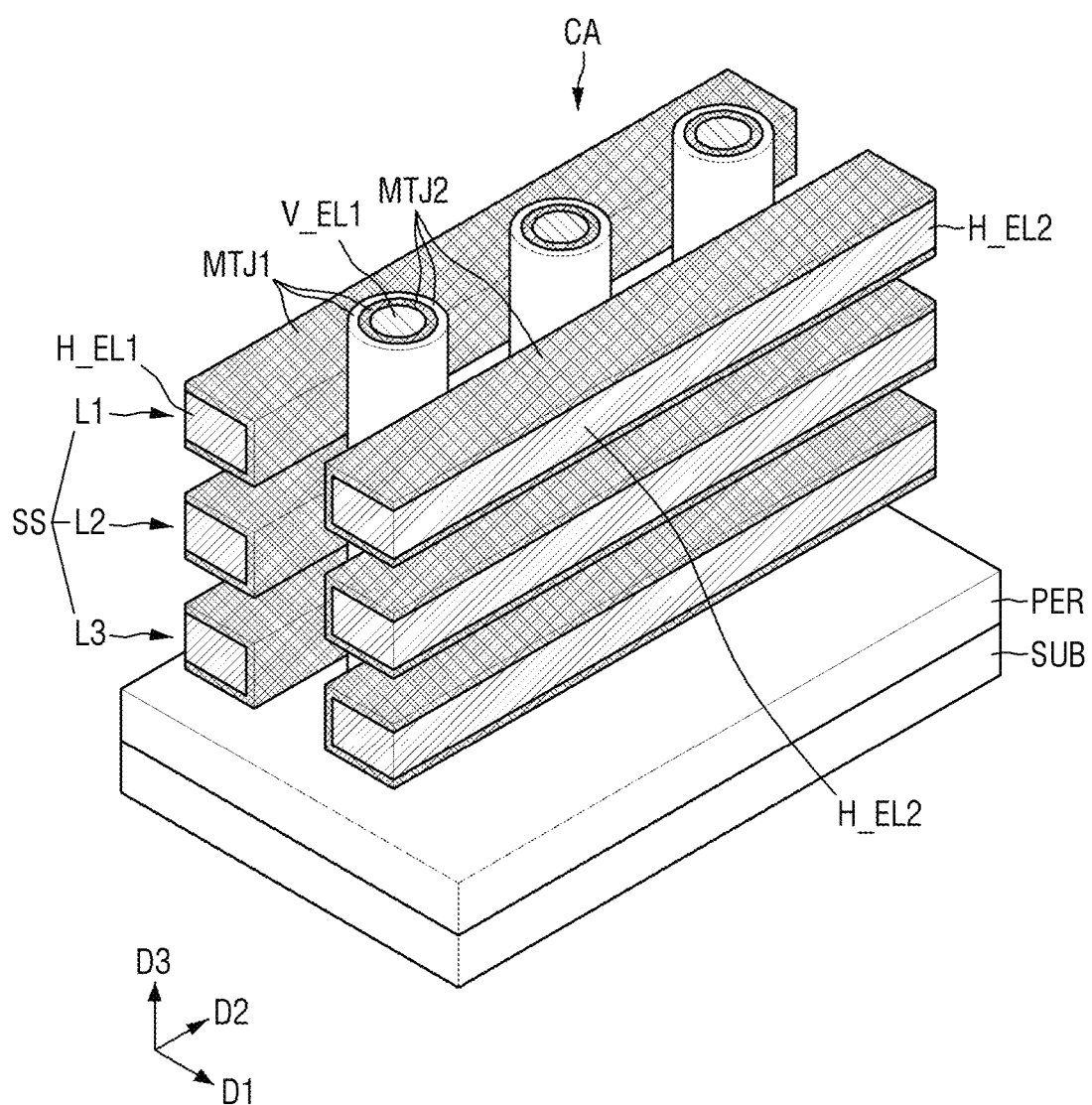
Figure 3:
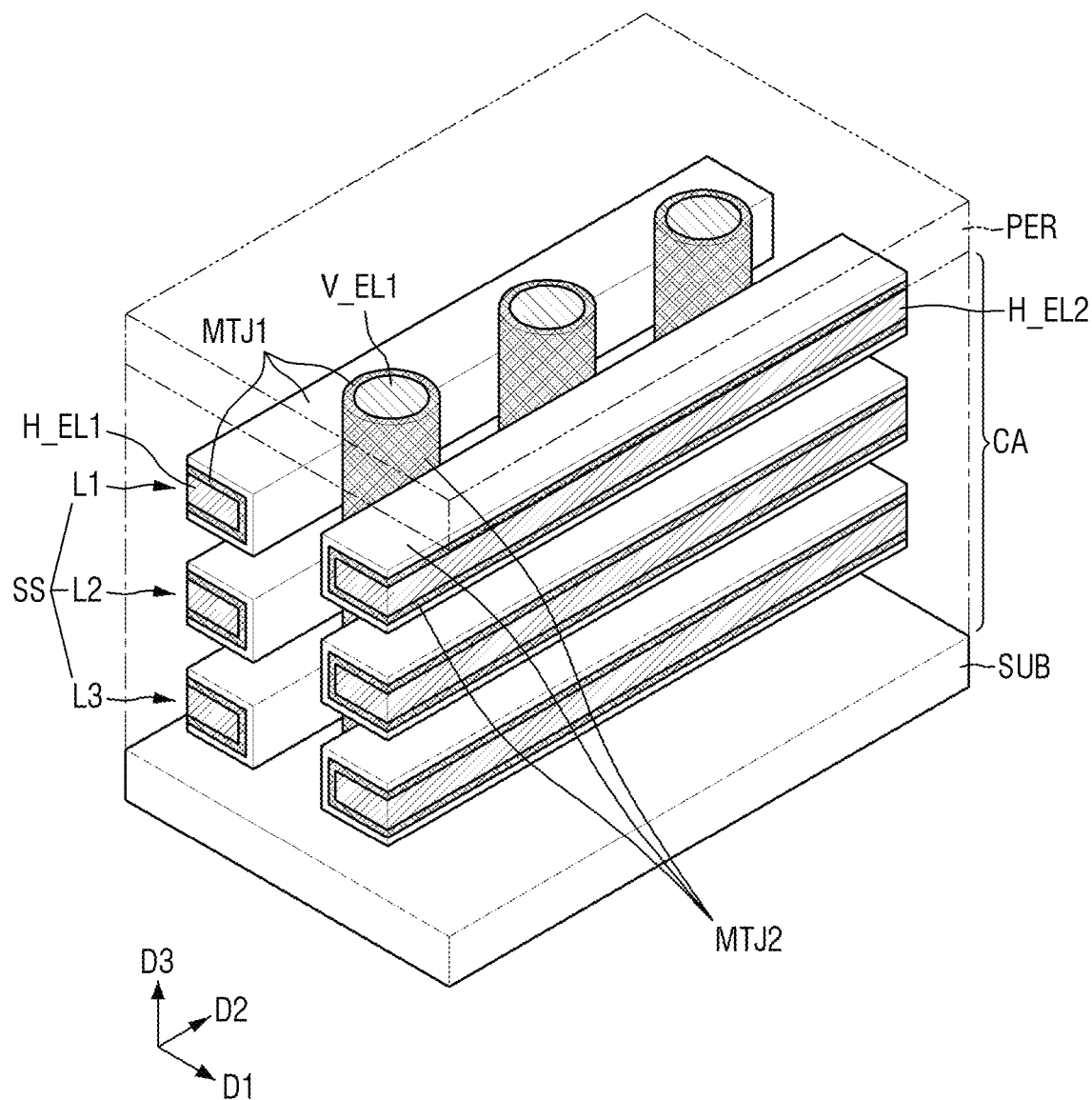

FIGS. 1 to 3 are example perspective views showing a semiconductor memory device according to some example embodiments, respectively.

Referring to FIGS. 1 and 2, the semiconductor memory device according to some example embodiments may include a peripheral circuit region PER and a cell array CA placed on a substrate SUB.

The peripheral circuit region PER may be placed on the substrate SUB.

The substrate SUB may be or may include bulk silicon or SOI (silicon-on-insulator). Alternatively or additionally, the substrate SUB may be a silicon substrate such as a doped or undoped single-crystal silicon substrate and/or may include other materials, but is not limited to, for example, silicon germanium, SGOI (silicon germanium on insulator), indium antimonide, lead tellurium compounds, indium arsenide, indium phosphide, gallium arsenide or gallium antimonide.

The peripheral circuit region PER may include active and/or passive electrical components such as resistors, capacitors, memristors, diodes, or transistors such as planar transistors/peripheral transistors provided on the substrate SUB. The peripheral circuit region PER may include a circuit for operating the cell array CA of the semiconductor memory device according to some example embodiments. Furthermore a thickness of the substrate SUB may be the same as, greater than, or less than, a thickness of the peripheral circuit region PER. The thickness of the substrate SUB and/or the thickness of the peripheral circuit region PER may be the same as, greater than, or less than the thickness of the cell array CA.

The cell array CA may be placed on the peripheral circuit region PER. In the semiconductor memory device according to some example embodiments, the peripheral circuit region PER may be placed between the cell array CA and the substrate SUB; however, example embodiments are not limited thereto.

A stacked structure SS including the first to third layers L1, L2, and L3 may be placed on the substrate SUB. For example, the stacked structure SS including the first to third layers L1, L2, and L3 may be placed on the peripheral circuit region PER.

Although the stacked structure SS are shown to include three layers L1, L2, and L3, this is only for convenience of explanation, and example embodiments is not limited thereto. There may be more than three layers, or less than three layers.

The first to third layers L1, L2, and L3 of the stacked structure SS may be stacked apart from each other in a direction opposite to/perpendicular to an upper face of the substrate SUB (for example, a third direction D3). Each of the first to third layers L1, L2, and L3 may include a first horizontal conductive line H_EL1, a second horizontal conductive line H_EL2, and a first vertical conductive line V_EL1. Also, each of the first to third layers L1, L2, and L3 may include a first magnetism tunnel junction pattern MTJ1 defined at an intersection point between the first horizontal conductive line H_EL1 and the first vertical conductive line V_EL1, and a second magnetic tunnel junction pattern MTJ2 defined at an intersection point between the second horizontal conductive line H_EL2 and the first vertical conductive line V_EL1. Each of the first to third layers L1, L2, and L3 may include (e.g. may have) the same structure; however, example embodiments are not limited thereto.

The first vertical conductive line V_EL1 may have a line shape and/or a pillar shape and/or a prism shape and/or a cylindrical shape extending in the third direction D3. Each first vertical conductive line V_EL1 may be spaced apart from each other along a second direction D2.

The first horizontal conductive line H_EL1 may have a line shape and/or a bar shape extending in the second direction D2. The first horizontal conductive lines H_EL1 may be placed apart from each other along the third direction D3.

The second horizontal conductive line H_EL2 may have a line shape and/or a bar shape extending in the second direction D2. The second horizontal conductive lines H_EL2 may be placed apart from each other along the third direction D3.

The second horizontal conductive line H_EL2 may be placed side by side with the first horizontal conductive line H_EL1. The second horizontal conductive line H_EL2 may be spaced apart from the corresponding first horizontal conductive line H_EL1 in a first direction D1. The first horizontal conductive line H_EL1 and the second horizontal conductive line H_EL2 may be spaced apart from each other with the first vertical conductive line V_EL1 interposed between them. The first horizontal conductive line H_EL1 and the second horizontal conductive line H_EL2 are electrically separated/electrically isolated/electrically insulated from each other.

The first magnetic tunnel junction patterns MTJ1 may be placed between the first horizontal conductive line H_EL1 and the first vertical conductive line V_EL1. The first magnetic tunnel junction patterns MTJ1 may be placed at each position of intersection between the first horizontal conductive line H_EL1 and the first vertical conductive line V_EL1. The first magnetic tunnel junction patterns MTJ1 placed along the second direction D2 may share the single first horizontal conductive line H_EL1.

The second magnetic tunnel junction patterns MTJ2 may be placed between the second horizontal conductive line H_EL2 and the first vertical conductive line V_EL1. The second magnetic tunnel junction patterns MTJ2 may be placed at each position of intersection between the second horizontal conductive line H_EL2 and the first vertical conductive line V_EL1. The second magnetic tunnel junction patterns MTJ2 placed along the second direction D2 may share the single second horizontal conductive line H_EL2.

The first magnetic tunnel junction pattern MTJ1 and the second magnetic tunnel junction pattern MTJ2 placed to correspond to each other in the first direction D1 may share/be connected to the first vertical conductive line V_EL1. For example, the first magnetic tunnel junction pattern MTJ1 and the second magnetic tunnel junction pattern MTJ2 placed on the first layer L1 may share the first vertical conductive line V_EL1.

The first magnetic tunnel junction pattern MTJ1 and the second magnetic tunnel junction pattern MTJ2 may each include a reference magnetic pattern, a free magnetic pattern, and a tunnel barrier pattern between the reference magnetic pattern and the free magnetic pattern. The first magnetic tunnel junction pattern MTJ1 may have the same structure as the second magnetic tunnel junction pattern MTJ2; however, example embodiments are not limited thereto.

In FIG. 1, a tunnel barrier pattern of the magnetic tunnel junction pattern may extend in the second direction D2 along the first horizontal conductive line H_EL1 and the second horizontal conductive line H_EL2. The tunnel barrier pattern may be shared by the first magnetic tunnel junction patterns MTJ1 placed along the second direction D2. The tunnel barrier pattern may be shared by the second magnetic tunnel junction patterns MTJ2 placed along the second direction D2.

In FIG. 2, the tunnel barrier pattern of the magnetic tunnel junction pattern may extend in the second direction D2 along the first vertical conductive line V_EL1. The tunnel barrier pattern may be shared by the first magnetic tunnel junction patterns MTJ1 placed along the third direction D2. The tunnel barrier pattern may be shared by the second magnetic tunnel junction patterns MTJ2 placed along the third direction D3. Alternatively or additionally, the tunnel barrier pattern may be shared by the first magnetic tunnel junction pattern MTJ1 and the second magnetic tunnel junction pattern MTJ2 placed to correspond to each other in the first direction D1.

The tunnel barrier pattern may include, for example, at least one of a magnesium (Mg) oxide film, a titanium (Ti) oxide film, an aluminum (Al) oxide film, a magnesium-zinc (Mg—Zn) oxide film or a magnesium-boron (Mg—B) oxide film.

The reference magnetic pattern and the free magnetic pattern may each include at least one or more magnetic layers, and may include the same, or a different, number of layers. The reference magnetic pattern may include a reference layer having a fixed magnetization direction that is fixed in one direction. The free magnetic pattern may include a free layer having a free magnetization direction that may change to be parallel or antiparallel to the fixed magnetization direction of the reference layer.

The reference magnetic pattern and the free magnetic pattern may each include at least one of an amorphous rare earth element alloy, a multilayer thin film in which a magnetic metal (FM) and a nonmagnetic metal (NM) are alternately stacked, an alloy having L10 type crystal structure, a cobalt-based alloy, and combinations thereof. The amorphous rare earth element alloy may include, for example, alloys such as at least one of TbFe, TbCo, TbFeCo, CoFeGd, CoFeFy, DyTbFeCo, and GdTbCo. The multilayer thin film in which the magnetic metal and the non-magnetic metal are alternately stacked may include, for example, multilayer thin films such as Co/Pt, Co/Pd, CoCr/Pt, CoCr/Pd, CoFe/Pt, CoFe/Pd, CoNi/Pt, Co/Ru, Co/Os, Co/Au, and Co/Ni. The alloy having the L10 type crystal structure may include, for example, alloys such as at least one of $Fe_{50}Pt_{50}$, $Fe_{50}Pd_{50}$, $Co_{50}Pt_{50}$, $Fe_{30}Ni_{20}Pt_{50}$, and $Co_{30}Ni_{20}Pt_{50}$. The cobalt-based alloy may include, for example, alloys such as at least one of CoCr, CoPt, CoCrPt, CoCrTa, CoCrPtTa, CoCrNb, and CoFeB. The reference magnetic pattern and the free magnetic pattern may include the same, or different, materials.

The first horizontal conductive line H_EL1, the second horizontal conductive line H_EL2, and the first vertical conductive line V_EL1 may each include a conductive material, for example the same or different conductive materials. The first horizontal conductive line H_EL1, the second horizontal conductive line H_EL2, and the first vertical conductive line V_EL1 may each include, for example, at least one of a metal, a metal alloy, and a conductive metal nitride.

Although not shown, empty spaces in the stacked structure SS may be filled with an insulating material. For example, the insulating material may include at least one of a silicon oxide film, a silicon nitride film, and a silicon oxynitride film. A wiring layer electrically connected to the cell array CA may be placed on the stacked structure SS. Although not shown, a peripheral circuit which operates the cell array CA may be formed on the substrate SUB. The peripheral circuit and the cell array may be connected, using the wiring layer.

As an example, the first direction D1, the second direction D2 and the third direction D3 may be, but are not limited to be, perpendicular to each other. Further, the first direction D1 and the second direction D2 may be parallel to the upper face of the substrate SUB, and the third direction D3 may be perpendicular to the upper face of the substrate SUB.

FIG. 3 mainly describes points different from those described using FIGS. 1 and 2; descriptions of similar features may be omitted for brevity.

Referring to FIG. 3, the cell array region CA may be placed on the substrate SUB. The peripheral circuit region PER may be placed on the cell array CA.

The cell array CA may be placed between the substrate SUB and the peripheral circuit region PER. As mentioned above, the peripheral circuit region PER may include a circuit for operating the cell array CA.

Unlike those shown in FIGS. 1 to 3, the cell array CA and the peripheral circuit region PER may be placed in different regions of the substrate SUB. For example, the peripheral circuit region PER and the cell array CA may not be stacked on the substrate SUB in the third direction D3.

Example embodiments are not limited to the features described above. Furthermore example embodiments are not necessarily mutually exclusive to one another. For example, some example embodiments may include some features described with reference to one figure, and may further include features described with reference to another figure.

Figure 4:
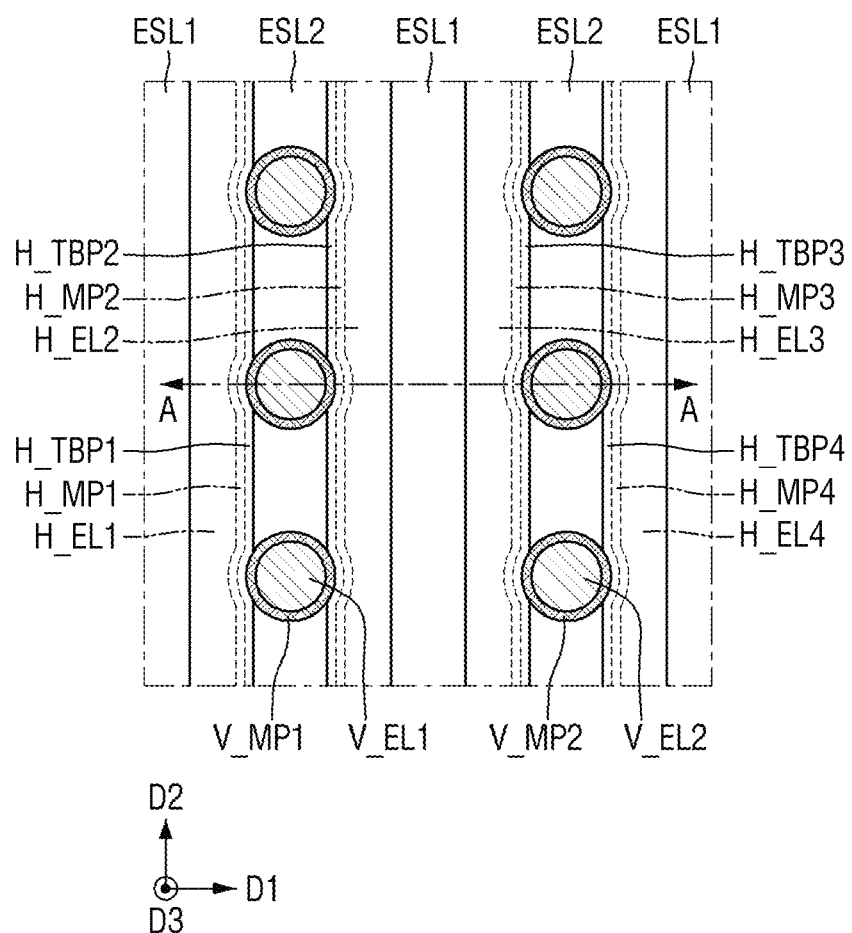
FIG. 4 is a plan view showing a semiconductor memory device according to some example embodiments.
Figure 5:
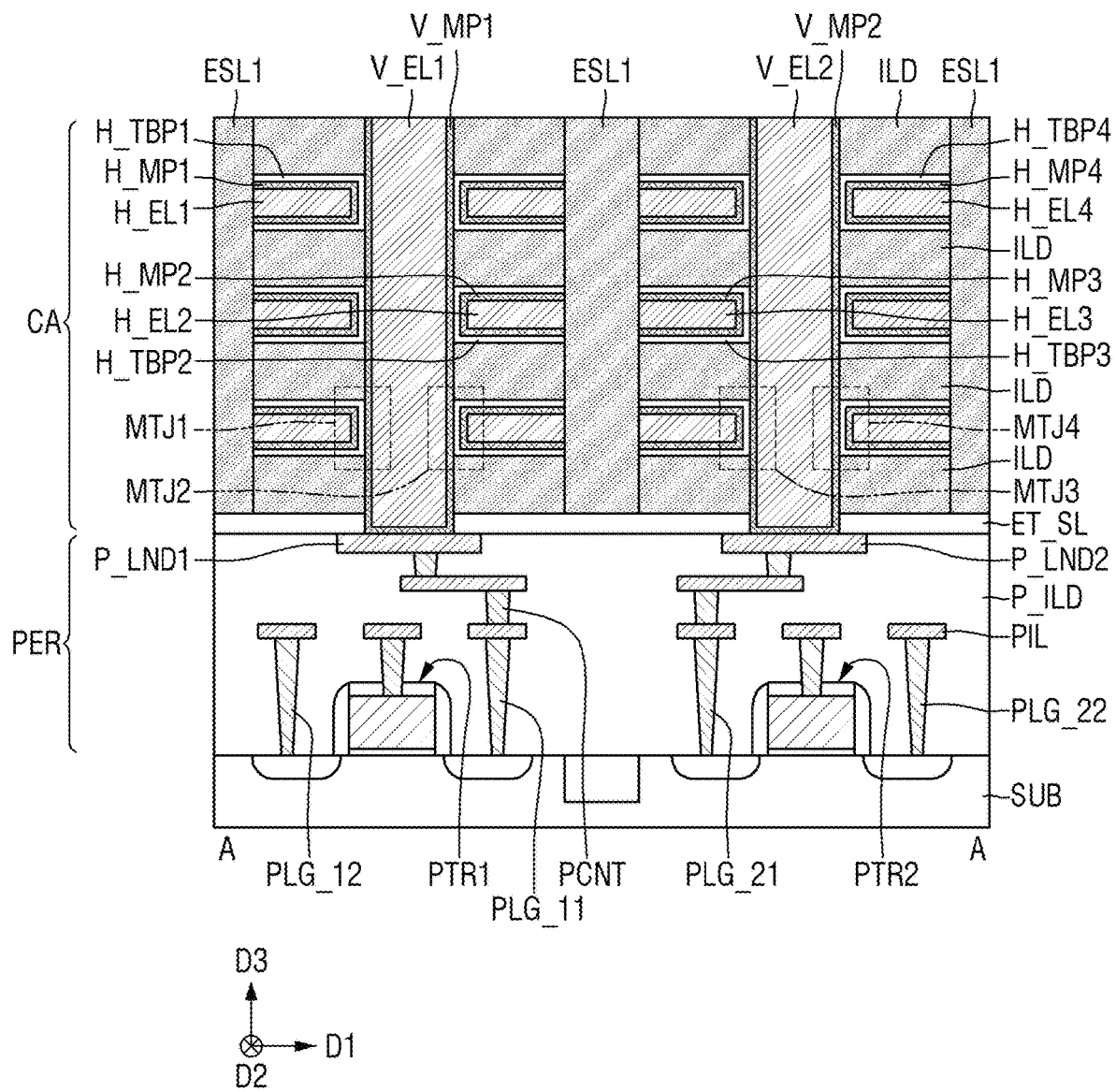
FIG. 5 is a cross-sectional view taken along a line A-A of FIG. 4.

FIG. 4 is a plan view showing a semiconductor memory device according to some example embodiments. FIG. 5 is a cross-sectional view taken along a line A-A of FIG. 4. For convenience of explanation, repeated parts of contents explained using FIG. 1 will be briefly described. For reference, FIG. 4 may be a plan view showing the semiconductor memory device shown in FIG. 1.

Referring to FIGS. 4 and 5, the semiconductor memory device according to some example embodiments may include a peripheral circuit region PER and a cell array CA. The cell array CA may be stacked on the peripheral circuit region PER in the third direction D3.

The peripheral circuit region PER may include peripheral circuits PTR1, PRT2, PIL, PCNT, PLG_11, PLG_12, PLG_21, and PLG_22 that control the cell array CA. The peripheral circuit region PER may further include peripheral connection pads P_LND1 and P_LND2 that connect the peripheral circuits PTR1, PRT2, PIL, PCNT, PLG_11, PLG_12, PLG_21, and PLG_22 to the cell array CA. At least some of the peripheral circuits PTR1, PRT2, PIL, PCNT, PLG_11, PLG_12, PLG_21, and PLG_22 may be inside/be formed inside the peripheral circuit insulating film P_ILD. The peripheral connection pads P_LND1 and P_LND2 may be formed in the peripheral circuit insulating film P_ILD.

For example, the peripheral circuit formed in the peripheral circuit region PER may include peripheral transistors PTR1 and PTR2, peripheral contact plugs PLG_11, PLG_12, PLG_21, and PLG_22 connected to source/drain regions of the peripheral transistors PTR1 and PTR2, the peripheral wirings PIL on the peripheral transistors PTR1 and PTR2, and the peripheral contacts PCNT that vertically connect the peripheral wirings PIL.

The first peripheral contact plugs PLG_11 and PLG_12 may be connected to the source/drain region of the first peripheral transistor PTR1. The second peripheral contact plugs PLG_21 and PLG_22 may be connected to the source/drain region of the second peripheral transistor PTR2. The peripheral wirings PIL are connected to the first peripheral contact plugs PLG_11 and PLG_12 and the second peripheral contact plugs PLG_21 and PLG_22. The peripheral wirings PIL are connected to the gate electrodes of the peripheral transistors PTR1 and PTR2. Peripheral connection pads P_LND1 and P_LND2 may be connected to peripheral transistors PTR1 and PTR2 through the peripheral wirings PIL and the peripheral contacts PCNT. Peripheral transistors PTR1 and PTR2 may be the same conductivity type, or may be different conductivity type; further, peripheral transistors PTR1 and PTR2 may be components of other circuitries such as components of other logic gates; however, example embodiments are not limited thereto.

Although not shown, the cell array CA may also be connected to the peripheral wirings PIL through a through silicon via (TSV) or the like.

Although the peripheral transistors PTR1 and PTR2 are shown as planar transistors, this is only for convenience of explanation, and example embodiments are not limited thereto. The peripheral transistors PTR1 and PTR2 may be at least one of one of fin-type transistor (FinFET) including a channel region of a fin-type pattern shape, a transistor including nanowire or nanosheet, a tunneling transistor (tunneling FET), a three-dimensional (3D) transistors (e.g., a vertical transistor (Vertical FET) or a transistor based on a two-dimensional material (2D material based FET).

The cell array CA may include first to fourth horizontal conductive lines H_EL1, H_EL2, H_EL3, and H_EL4, first and second vertical conductive lines V_EL1 and V_EL2, first to fourth horizontal magnetic patterns H_MP1, H_MP2, H_MP3, and H_MP4, first and second vertical magnetic patterns V_MP1 and V_MP2, and first to fourth horizontal tunnel barrier patterns H_TBP1, H_TBP2, H_TBP3, and H_TBP4.

An etching stop film ET_SL may be placed on the peripheral circuit insulating film P_ILD. The etching stop film ET_SL may include an insulating material such as at least one of a nitride or an oxide. The etching stop film ET_SL may include a material having an etching selectivity of the material included in the mold structure (refer to MIL of FIG. 19B).

The plurality of mold insulating layers ILD may be placed on the etching stop film ET_SL. Each mold insulating layer ILD may be spaced in the third direction D3. Although FIG. 5 shows four mold insulating layers ILD, this is only for convenience of explanation, and example embodiments are not limited thereto.

The mold insulating layer ILD may include an insulating material. The mold insulating layer ILD may include, for example, at least one of a silicon oxide film, a silicon nitride film, a silicon oxynitride film, a carbon-including silicon oxide film, a carbon-including silicon nitride film, and a carbon-including silicon oxynitride film, and may not include a material included in the etching stop film ET_SL.

A plurality of first horizontal conductive lines H_EL1 may be stacked in the third direction D3. Each first horizontal conductive line H_EL1 may extend long in the second direction D2. Each first horizontal conductive line H_EL1 may be aligned with/parallel with the upper face of the substrate SUB. The first horizontal conductive line H_EL1 may be placed between the mold insulating layers ILD spaced in the third direction D3.

The plurality of second horizontal conductive lines H_EL2 may be stacked in the third direction D3. Each second horizontal conductive line H_EL2 may extend long in the second direction D2. Each second horizontal conductive line H_EL2 may be aligned with/parallel with the upper face of the substrate SUB. The second horizontal conductive line H_EL2 may be placed between the mold insulating layers ILD spaced in the third direction D3. The second horizontal conductive line H_EL2 may be spaced apart from the corresponding first horizontal conductive line H_EL1 in the first direction D1.

The first horizontal conductive lines H_EL1 adjacent to each other in the third direction D3 are separated by the mold insulating layer ILD, the first electrode separation pattern ESL1, and the second electrode separation pattern ESL2. The second horizontal conductive lines H_EL2 adjacent to each other in the third direction D3 are separated by the mold insulating layer ILD, the first electrode separation pattern ESL1, and the second electrode separation pattern ESL2. The second electrode separation pattern ESL2 separates the first horizontal conductive line H_EL1 and the second horizontal conductive line H_EL2 adjacent to each other in the first direction D1.

The first electrode separation pattern ESL1 and the second electrode separation pattern ESL2 each include an insulating material such as at least one of a nitride or an oxide.

The first vertical conductive line V_EL1 may extend in the third direction D3. The first vertical conductive lines V_EL1 arranged in the second direction D2 may be placed in the second electrode separation pattern ESL2. The second electrode separation pattern ESL2 may be placed between the first vertical conductive lines V_EL1 adjacent to each other in the second direction D2.

The first vertical conductive line V_EL1 may be placed between the first horizontal conductive line H_EL1 and the second horizontal conductive line H_EL2. The first vertical conductive line V_EL1 may intersect the plurality of first horizontal conductive lines H_EL1 and the plurality of second horizontal conductive lines H_EL2 at the same time.

The first vertical conductive line V_EL1 may extend to a first peripheral connection pad P_LND1. The first vertical conductive line V_EL1 may be connected to (electrically connected to) the first peripheral connection pad P_LND1.

A plurality of third horizontal conductive lines H_EL3 may be stacked in the third direction D3. Each third horizontal conductive line H_EL3 may extend long in the second direction D2. Each third horizontal conductive line H_EL3 may be aligned with (parallel with) the upper face of the substrate SUB. The third horizontal conductive line H_EL3 may be placed between the mold insulating layers ILD spaced in the third direction D3. The third horizontal conductive line H_EL3 may be spaced apart from the second horizontal conductive line H_EL2 in the first direction D1. The third horizontal conductive line H_EL3 and the second horizontal conductive line H_EL2 spaced in the first direction D1 are separated by the first electrode separation pattern ESL1.

A plurality of fourth horizontal conductive lines H_EL4 may be stacked in the third direction D3. Each fourth horizontal conductive line H_EL4 may extend long in the second direction D2. Each fourth horizontal conductive line H_EL4 may be aligned with (parallel with) the upper face of the substrate SUB. The fourth horizontal conductive line H_EL4 may be placed between the mold insulating layers ILD spaced in the third direction D3. The fourth horizontal conductive line H_EL4 may be spaced apart from the corresponding third horizontal conductive line H_EL3 in the first direction D1.

The third horizontal conductive lines H_EL3 adjacent to each other in the third direction D3 are separated by the mold insulating layer ILD, the first electrode separation pattern ESL1, and the second electrode separation pattern ESL2. The fourth horizontal conductive lines H_EL4 adjacent to each other in the third direction D3 are separated by the mold insulating layer ILD, the first electrode separation pattern ESL1, and the second electrode separation pattern ESL2. The second electrode separation pattern ESL2 separates the third horizontal conductive line H_EL3 and the fourth horizontal conductive line H_EL4 adjacent to each other in the first direction D1.

The second vertical conductive line V_EL2 may extend in the third direction D3. The second vertical conductive line V_EL2 arranged in the second direction D2 may be placed in the second electrode separation pattern ESL2. The second electrode separation pattern ESL2 may be placed between the second vertical conductive lines V_EL2 adjacent to each other in the second direction D2. The second vertical conductive line V_EL2 may be spaced apart from the first vertical conductive line V_EL1 in the first direction D1.

The second vertical conductive line V_EL2 may be placed between the third horizontal conductive line H_EL3 and the fourth horizontal conductive line H_EL4. The second vertical conductive line V_EL2 may intersect the plurality of third horizontal conductive lines H_EL3 and the plurality of fourth horizontal conductive lines H_EL4 at the same time.

The second vertical conductive line V_EL2 may extend to a second peripheral connection pad P_LND2. The second vertical conductive line V_EL2 may be connected to the second peripheral connection pad P_LND2.

In the semiconductor memory device according to some example embodiments, the second vertical conductive line V_EL2 is not electrically connected to/is electrically isolated from the first vertical conductive line V_EL1.

The first to fourth horizontal conductive lines H_EL1, H_EL2, H_EL3, and H_EL4 and the first and second vertical conductive lines V_EL1 and V_EL2 may each include, for example, at least one of a metal, a metal alloy, and a conductive metal nitride, and may include the same or different materials.

The first horizontal magnetic pattern H_MP1 and the first horizontal tunnel barrier pattern H_TBP1 may each extend along an upper face of the first horizontal conductive line H_EL1, a bottom face of the first horizontal conductive line H_EL1, and side walls of the first horizontal conductive line H_EL1, e.g. may be conformal to the first horizontal conductive line H_EL1. The first horizontal magnetic pattern H_MP1 and the first horizontal tunnel barrier pattern H_TBP1 may each extend in the second direction D2. The upper face of the first horizontal conductive line H_EL1 may be a face opposite to the bottom face of the first horizontal conductive line H_EL1 in the third direction D3. The first horizontal magnetic pattern H_MP1 and the first horizontal tunnel barrier pattern H_TBP1 are formed between the first horizontal conductive line H_EL1 and the first vertical conductive line V_EL1. The first horizontal magnetic pattern H_MP1 and the first horizontal tunnel barrier pattern H_TBP1 are not formed between the first horizontal conductive line H_EL1 and the first electrode separation pattern ESL1. The first horizontal magnetic pattern H_MP1 is placed between the first horizontal conductive line H_EL1 and the first horizontal tunnel barrier pattern H_TBP1.

The second horizontal magnetic pattern H_MP2 and the second horizontal tunnel barrier pattern H_TBP2 may each extend along an upper face of the second horizontal conductive line H_EL2, a bottom face of the second horizontal conductive line H_EL2, and side walls of the second horizontal conductive line H_EL2, e.g. may be conformal to the second horizontal conductive line H_EL2. The second horizontal magnetic pattern H_MP2 and the second horizontal tunnel barrier pattern H_TBP2 may each extend in the second direction D2. The second horizontal magnetic pattern H_MP2 is placed between the second horizontal conductive line H_EL2 and the second horizontal tunnel barrier pattern H_TBP2.

A third horizontal magnetic pattern H_MP3 and the third horizontal tunnel barrier pattern H_TBP3 may each extend along an upper face of the third horizontal conductive line H_EL3, a bottom face of the third horizontal conductive line H_EL3, and side walls of the third horizontal conductive line H_EL3. The third horizontal magnetic pattern H_MP3 and the third horizontal tunnel barrier pattern H_TBP3 may each extend in the second direction D2. The third horizontal magnetic pattern H_MP3 may be placed between the third horizontal conductive line H_EL3 and the third horizontal tunnel barrier pattern H_TBP3.

A fourth horizontal magnetic pattern H_MP4 and the fourth horizontal tunnel barrier pattern H_TBP4 may each extend along an upper face of the fourth horizontal conductive line H_EL4, a bottom face of the fourth horizontal conductive line H_EL4, and side walls of the fourth horizontal conductive line H_EL4. The fourth horizontal magnetic pattern H_MP4 and the fourth horizontal tunnel barrier pattern H_TBP4 may each extend in the second direction D2. The fourth horizontal magnetic pattern H_MP4 may be placed between the fourth horizontal conductive line H_EL4 and the fourth horizontal tunnel barrier pattern H_TBP4.

The first vertical magnetic pattern V_MP1 may extend along the side walls of the first vertical conductive line V_EL1 and the bottom face of the first vertical conductive line V_EL1. The first vertical magnetic pattern V_MP1 may extend in the third direction D3. A part of the first vertical magnetic pattern V_MP1 may be formed between the first vertical conductive line V_EL1 and the first peripheral connection pad P_LND1. Unlike the shown configuration, the first vertical magnetic pattern V_MP1 may not extend along the bottom face of the first vertical conductive line V_EL1.

The second vertical magnetic pattern V_MP2 may extend along the side walls of the second vertical conductive line V_EL2 and the bottom face of the second vertical conductive line V_EL2. The second vertical magnetic pattern V_MP2 may extend in the third direction D3. A part of the second vertical magnetic pattern V_MP2 may be formed between the second vertical conductive line V_EL2 and the second peripheral connection pad P_LND2. Unlike the shown configuration, the second vertical magnetic pattern V_MP2 may not extend along the bottom face of the second vertical conductive line V_EL2.

A plurality of first magnetic tunnel junction patterns MTJ1 may be defined between the first vertical conductive line V_EL1 and each first horizontal conductive line H_EL1. The plurality of first magnetic tunnel junction patterns MTJ1 may be placed between the first vertical conductive line V_EL1 and each first horizontal conductive line H_EL1. Each first magnetic tunnel junction pattern MTJ1 may be placed in the third direction D3. Each first magnetic tunnel junction pattern MTJ1 may include a first vertical magnetic pattern V_MP1, a first horizontal magnetic pattern H_MP1, and a first horizontal tunnel barrier pattern H_TBP1.

A plurality of second magnetic tunnel junction patterns MTJ2 may be defined between the first vertical conductive line V_EL1 and each second horizontal conductive line H_EL1. The plurality of second magnetic tunnel junction patterns MTJ2 may be placed between the first vertical conductive line V_EL1 and each second horizontal conductive line H_EL2. Each second magnetic tunnel junction pattern MTJ2 may be placed in the third direction D3. Each second magnetic tunnel junction pattern MTJ2 may include a first vertical magnetic pattern V_MP1, a second horizontal magnetic pattern H_MP2, and a second horizontal tunnel barrier pattern H_TBP1.

A plurality of third magnetic tunnel junction patterns MTJ3 may be defined between the second vertical conductive line V_EL2 and each third horizontal conductive line H_EL3. The plurality of third magnetic tunnel junction patterns MTJ3 may be placed between the second vertical conductive line V_EL2 and each third horizontal conductive line H_EL3. Each third magnetic tunnel junction pattern MTJ3 may be placed in the third direction D3. Each third magnetic tunnel junction pattern MTJ3 may include a second vertical magnetic pattern V_MP2, a third horizontal magnetic pattern H_MP3, and a third horizontal tunnel barrier pattern H_TBP3.

A plurality of fourth magnetic tunnel junction patterns MTJ4 may be defined between the second vertical conductive line V_EL2 and each fourth horizontal conductive line H_EL4. The plurality of fourth magnetic tunnel junction patterns MTJ4 may be placed between the second vertical conductive line V_EL2 and each fourth horizontal conductive line H_EL4. Each fourth magnetic tunnel junction pattern MTJ4 may be placed in the third direction D3. Each fourth magnetic tunnel junction pattern MTJ4 may include a second vertical magnetic pattern V_MP2, a fourth horizontal magnetic pattern H_MP4, and a fourth horizontal tunnel barrier pattern H_TBP4. Each of the first through fourth magnetic tunnel junction patterns MTJ1 to MTJ4 may include the same material; however, example embodiments are not limited thereto.

As an example, the first to fourth horizontal magnetic patterns H_MP1, H_MP2, H_MP3, and H_MP4 may each be the reference magnetic patterns explained using FIG. 1. The first and second vertical magnetic patterns V_MP1 and V_MP2 may each be the free magnetic patterns explained using FIG. 1. The first to fourth horizontal tunnel barrier patterns H_TBP1, H_TBP2, H_TBP3, and H_TBP4 are each the tunnel barrier patterns explained using FIG. 1.

At this time, the free magnetic patterns of each first magnetic tunnel junction pattern MTJ1 placed in the third direction D3 are connected to each other. However, the reference magnetic patterns and the tunnel barrier patterns of each first magnetic tunnel junction pattern MTJ1 placed in the third direction D3 are separated from each other.

The aforementioned contents are also applied to the second to fourth magnetic tunnel junction patterns MTJ2, MTJ3, and MTJ4.

Alternatively, the first to fourth horizontal magnetic patterns H_MP1, H_MP2, H_MP3, and H_MP4 may each be the free magnetic patterns explained using FIG. 1. The first and second vertical magnetic patterns V_MP1 and V_MP2 may each be the reference magnetic patterns explained using FIG. 1. The first to fourth horizontal tunnel barrier patterns H_TBP1, H_TBP2, H_TBP3, and H_TBP4 are each the tunnel barrier patterns explained using FIG. 1.

At this time, the reference magnetic patterns of each first magnetic tunnel junction pattern MTJ1 placed in the third direction D3 are connected to each other. However, the free magnetic patterns and the tunnel barrier patterns of each first magnetic tunnel junction pattern MTJ1 placed in the third direction D3 are separated from each other.

The aforementioned contents are also applied to the second to fourth magnetic tunnel junction patterns MTJ2, MTJ3, and MTJ4.

Figure 6:
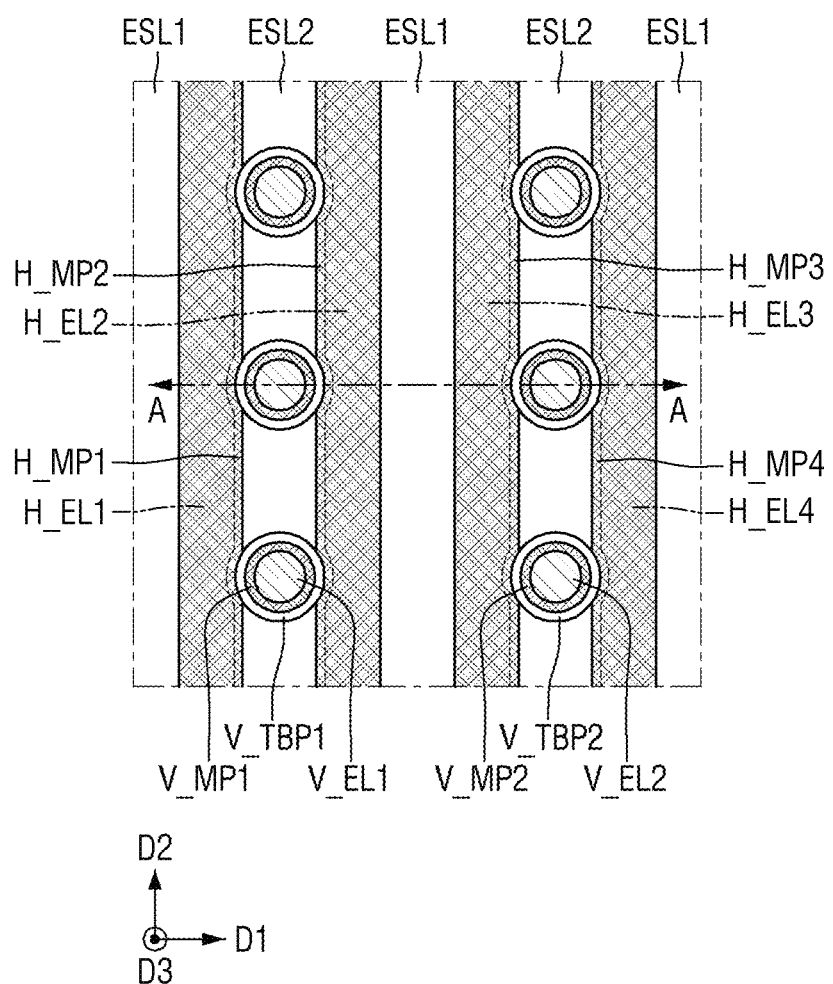
FIG. 6 is a plan view showing a semiconductor memory device according to some example embodiments.
Figure 7:
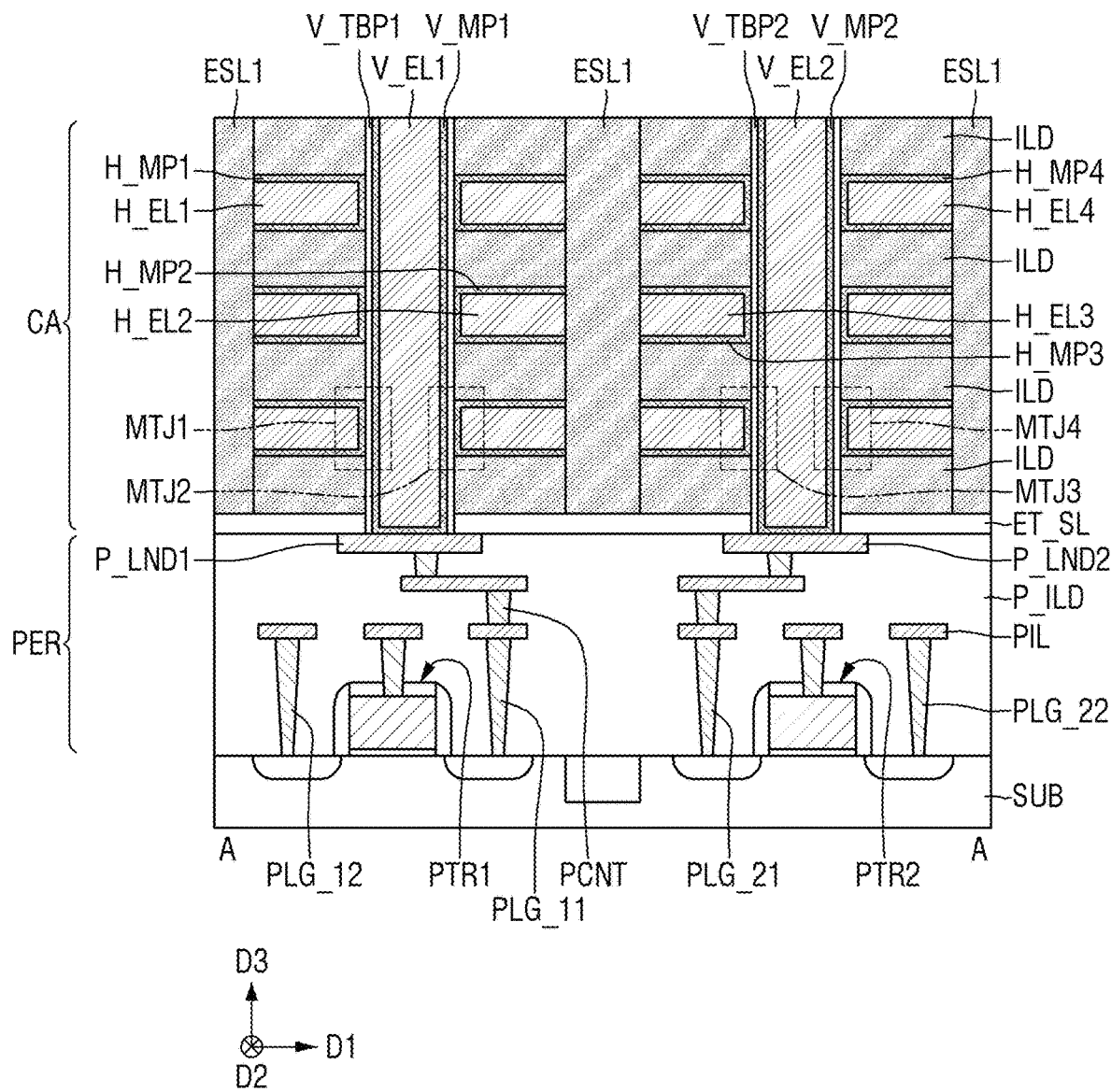
FIG. 7 is a cross-sectional view taken along a line A-A of FIG. 6.

FIG. 6 is a plan view showing a semiconductor memory device according to some example embodiments. FIG. 7 is a cross-sectional view taken along a line A-A of FIG. 6. For convenience of explanation, the points different from those explained using FIGS. 4 and 5 will be mainly described. For reference, FIG. 6 may be a plan view showing the semiconductor memory device shown in FIG. 2.

Referring to FIGS. 6 and 7, in the semiconductor memory device according to some example embodiments, the cell array CA may include first to fourth horizontal conductive lines H_EL1, H_EL2, H_EL3, and H_EL4, first and second vertical conductive lines V_EL1 and V_EL2, first to fourth horizontal magnetic patterns H_MP1, H_MP2, H_MP3, and H_MP4, first and second vertical magnetic patterns V_MP1 and V_MP2, and first and second vertical tunnel barrier patterns V_TBP1 and V_TBP2.

The first vertical tunnel barrier pattern V_TBP1 may extend along the side walls of the first vertical conductive line V_EL1. The first vertical tunnel barrier pattern V_TBP1 may extend in the third direction D3. The first vertical tunnel barrier pattern V_TBP1 does not extend along the bottom face of the first vertical conductive line V_EL1. The first vertical tunnel barrier pattern V_TBP1 is not between/formed between the bottom face of the first vertical conductive line V_EL1 and the upper face of the first peripheral connection pad P_LND1.

The second vertical tunnel barrier pattern V_TBP2 may extend along the side walls of the second vertical conductive line V_EL2. The second vertical tunnel barrier pattern V_TBP2 may extend in the third direction D3. The second vertical tunnel barrier pattern V_TBP2 does not extend along the bottom face of the second vertical conductive line V_EL2. The second vertical tunnel barrier pattern V_TBP2 is not between/formed between the bottom face of the second vertical conductive line V_EL2 and the upper face of the second peripheral connection pad P_LND2.

Each first magnetic tunnel junction pattern MTJ1 may include a first vertical magnetic pattern V_MP1, a first horizontal magnetic pattern H_MP1, and a first vertical tunnel barrier pattern V_TBP1.

Each second magnetic tunnel junction pattern MTJ2 may include a first vertical magnetic pattern V_MP1, a second horizontal magnetic pattern H_MP2, and a first vertical tunnel barrier pattern V_TBP1.

Each third magnetic tunnel junction pattern MTJ3 may include a second vertical magnetic pattern V_MP2, a third horizontal magnetic pattern H_MP3, and a second vertical tunnel barrier pattern V_TBP2.

Each fourth magnetic tunnel junction pattern MTJ4 may include a second vertical magnetic pattern V_MP2, a fourth horizontal magnetic pattern H_MP4, and a second vertical tunnel barrier pattern V_TBP2.

As an example, the first to fourth horizontal magnetic patterns H_MP1, H_MP2, H_MP3, and H_MP4 may each be the reference magnetic patterns explained using FIG. 1. The first and second vertical magnetic patterns V_MP1 and V_MP2 may each be the free magnetic patterns explained using FIG. 1. The first and second vertical tunnel barrier patterns V_TBP1 and V_TBP2 are each the tunnel barrier patterns explained using FIG. 1.

At this time, the free magnetic patterns and the tunnel barrier patterns of each first magnetic tunnel junction pattern MTJ1 placed in the third direction D3 are connected to each other. However, the reference magnetic patterns of each first magnetic tunnel junction pattern MTJ1 placed in the third direction D3 are separated from each other.

The aforementioned contents are also applied to the second to fourth magnetic tunnel junction patterns MTJ2, MTJ3, and MTJ4.

Alternatively, the first to fourth horizontal magnetic patterns H_MP1, H_MP2, H_MP3, and H_MP4 may each be the free magnetic patterns explained using FIG. 1. The first and second vertical magnetic patterns V_MP1 and V_MP2 may each be the reference magnetic patterns explained using FIG. 1. The first and second vertical tunnel barrier patterns V_TBP1 and V_TBP2 are each the tunnel barrier patterns explained using FIG. 1.

At this time, the reference magnetic patterns and the tunnel barrier patterns of each first magnetic tunnel junction pattern MTJ1 placed in the third direction D3 are connected to each other. However, the free magnetic patterns of each first magnetic tunnel junction pattern MTJ1 placed in the third direction D3 are separated from each other.

The aforementioned contents are also applied to the second to fourth magnetic tunnel junction patterns MTJ2, MTJ3, and MTJ4.

Figure 8:
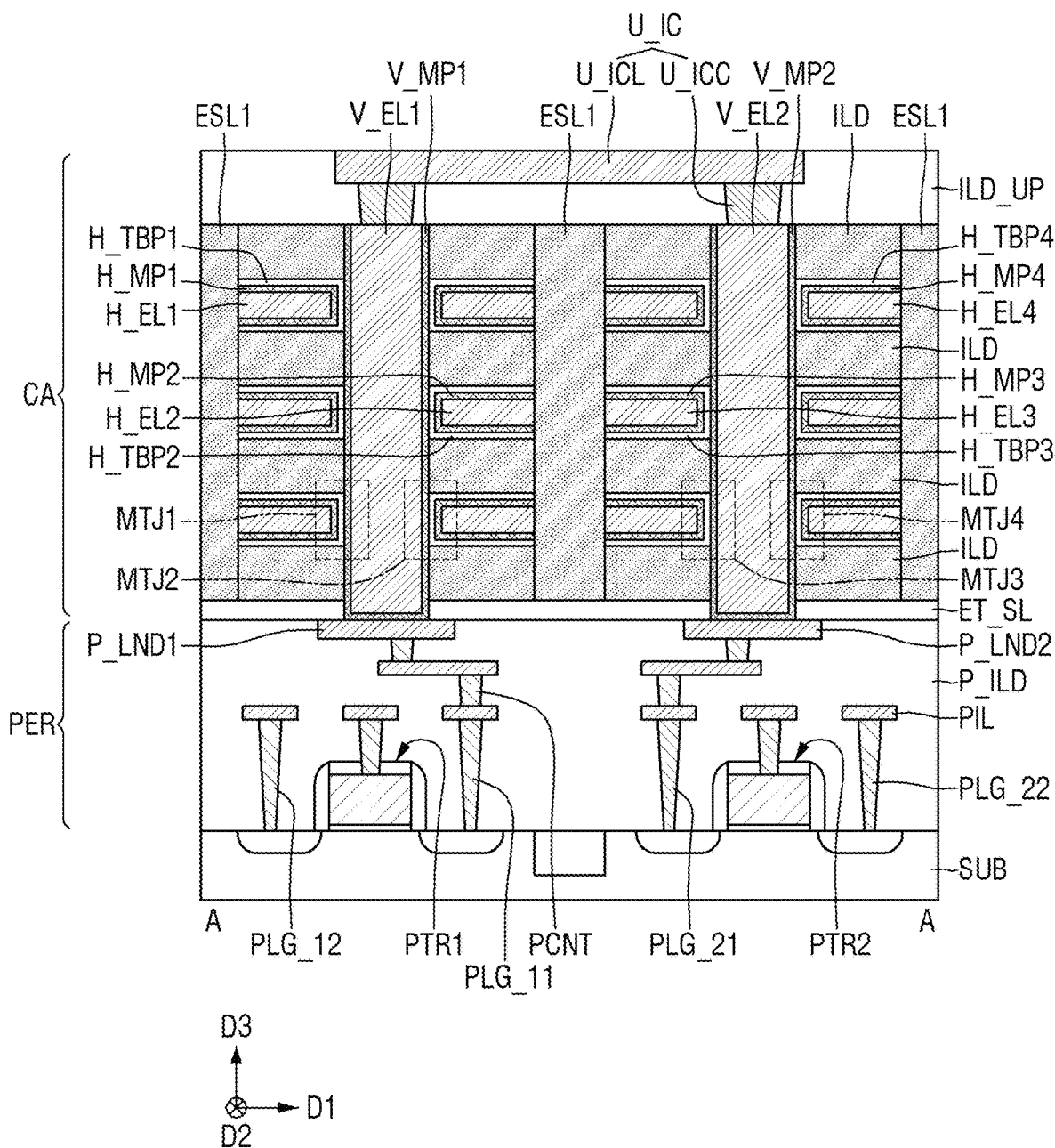
FIG. 8 is a diagram for explaining the semiconductor memory device according to some example embodiments.
Figure 9:
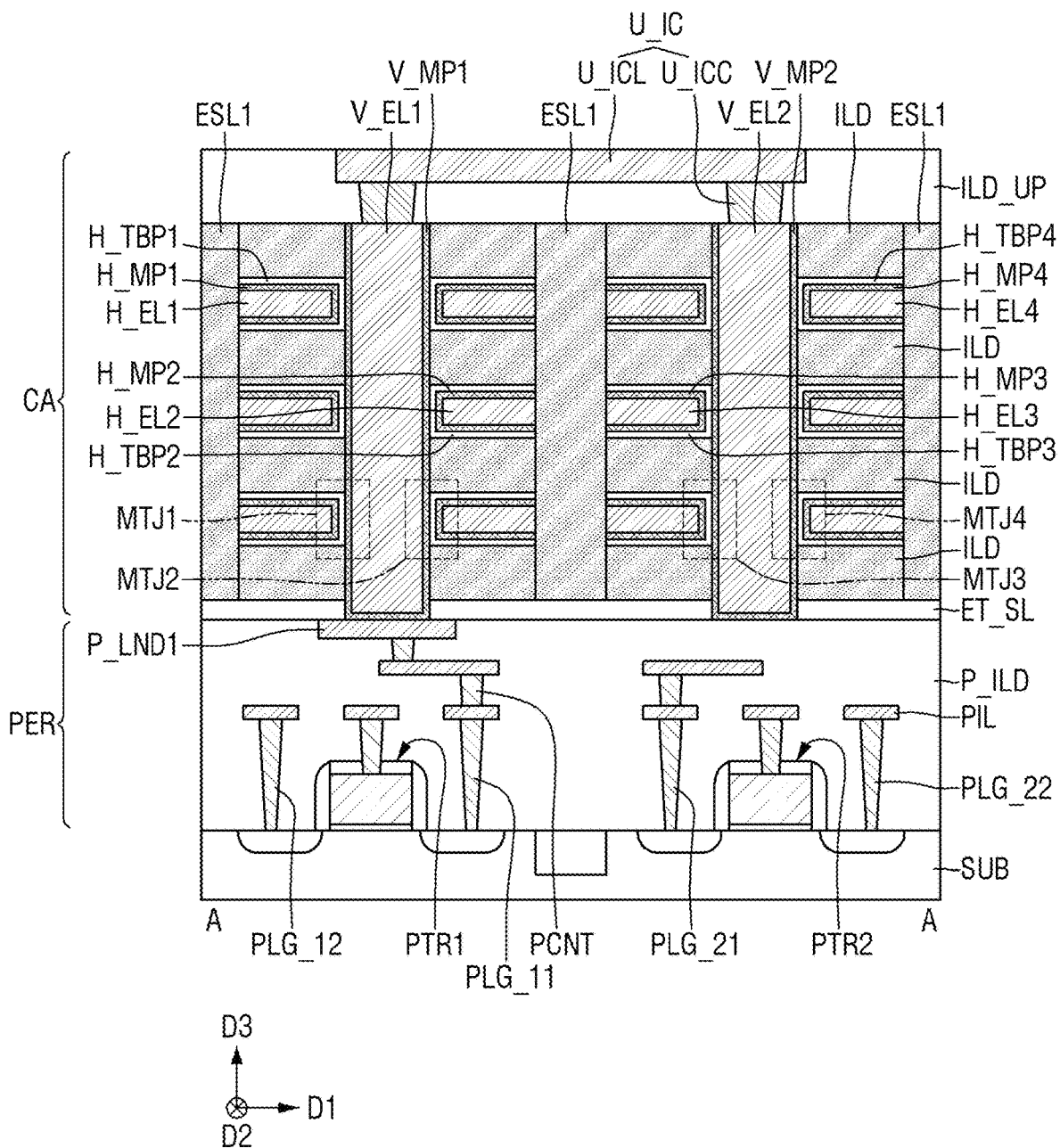
FIG. 9 is a diagram for explaining the semiconductor memory device according to some example embodiments.

FIG. 8 is a diagram for explaining the semiconductor memory device according to some example embodiments. FIG. 9 is a diagram for explaining the semiconductor memory device according to some example embodiments. For convenience of explanation, the points different from those explained using FIGS. 4 and 5 will be mainly described.

Referring to FIGS. 8 and 9, in the semiconductor memory device according to some example embodiments, the cell array CA may further include an upper connection structure U_IC that connects (electrically connects/shorts) the first vertical conductive line V_EL1 and the second vertical conductive line V_EL2.

The upper connection structure U_IC may connect the first vertical conductive line V_EL1 and the second vertical conductive line V_EL2 adjacent to each other in the first direction D1. The upper connection structure U_IC may connect the two vertical conductive lines adjacent to each other in the first direction D1.

The upper connection structure U_IC may include an upper connection contact U_ICC and an upper connection wiring U_ICL. The upper connection contact U_ICC may be connected to each of the first vertical conductive line V_EL1 and the second vertical conductive line V_EL2. The upper connection wiring U_ICL may connect the upper connection contact U_ICC on the first vertical conductive line V_EL1 and the upper connection contact U_ICC on the second vertical conductive line V_EL2. The upper connection wiring U_ICL connects the first vertical conductive line V_EL1 and the second vertical conductive line V_EL2. The upper connection contact U_ICC and the upper connection wiring U_ICL may each include, for example, at least one of a metal, a metal alloy, and a conductive metal nitride.

The upper connection structure U_IC may be placed inside the upper interlayer insulating film ILD_UP. The upper interlayer insulating film ILD_UP may be placed on the first to fourth horizontal conductive lines H_EL1, H_EL2, H_EL3, and H_EL4 and the first and second vertical conductive lines V_EL1 and V_EL2. For example, the upper connection structure U_IC may be placed on the first to fourth horizontal conductive lines H_EL1, H_EL2, H_EL3, and H_EL4 and the first and second vertical conductive lines V_EL1 and V_EL2. The upper interlayer insulating film ILD_UP may include, for example, an insulating material.

In FIG. 8, the first vertical conductive line V_EL1 and the second vertical conductive line V_EL2 connected by the upper connection wiring U_ICL may each be connected to the first and second peripheral connection pads P_LND1 and P_LND2.

In FIG. 9, in the first vertical conductive line V_EL1 and the second vertical conductive line V_EL2 connected by the upper connection wiring U_ICL, the first vertical conductive line V_EL1 may be connected to the first peripheral connection pad P_LND1. However, the second vertical conductive line V_EL2 is not connected to (e.g. is isolated from) the peripheral connection pad P_LND1.

Figure 10:
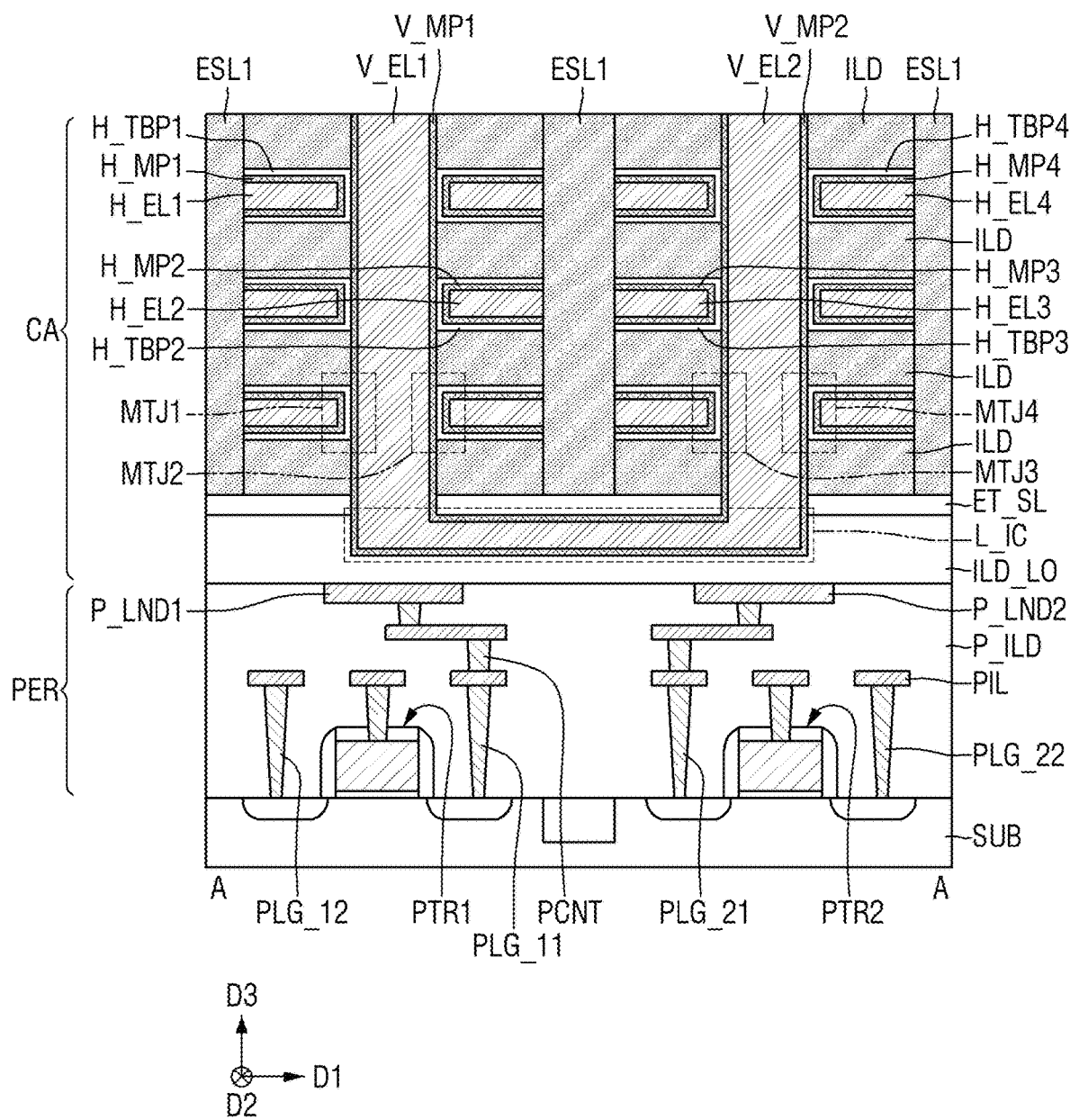
FIG. 10 is a diagram for explaining the semiconductor memory device according to some example embodiments.

FIG. 10 is a diagram for explaining a semiconductor memory device according to some example embodiments. For convenience of explanation, the points different from those explained using FIGS. 4 and 5 will be mainly described.

Referring to FIG. 10, in the semiconductor memory device according to some example embodiments, the cell array CA may further include a lower connection structure L_IC that connects the first vertical conductive line V_EL1 and the second vertical conductive line V_EL2.

The lower connection structure L_IC may connect the first vertical conductive line V_EL1 and the second vertical conductive line V_EL2 adjacent to each other in the first direction D1. The lower connection structure L_IC may connect the two vertical conductive lines adjacent to each other in the first direction D1.

The lower connection structure L_IC may be formed at the same level as the first and second vertical conductive lines V_EL1 and V_EL2. Here, the term "same level" means that the first and second vertical conductive lines are formed by the same fabricating process. Additionally, while the first and second vertical magnetic patterns V_MP1 and V_MP2 are formed, a part of the lower connection structure L_IC may be formed. For example, the lower connection structure L_IC may include materials included in the first and second vertical conductive lines V_EL1 and V_EL2 and the first and second vertical magnetic patterns V_MP1 and V_MP2.

Unlike the shown configuration, after the first and second vertical magnetic patterns V_MP1 and V_MP2 are formed, the lower connection structure L_IC may be formed at the same time as the first and second vertical conductive lines V_EL1 and V_EL2. In such cases, the lower connection structure L_IC may include the same material as the first and second vertical conductive lines V_EL1 and V_EL2.

The lower connection structure L_IC may be placed inside the lower interlayer insulating film ILD_LO. The lower interlayer insulating film ILD_UP may be placed between the etching stop film ET_SL and the substrate SUB. The lower connection structure L_IC may be placed below the first to fourth horizontal conductive lines H_EL1, H_EL2, H_EL3, and H_EL4, and the first and second vertical conductive lines V_EL1 and V_EL2.

Figure 11:
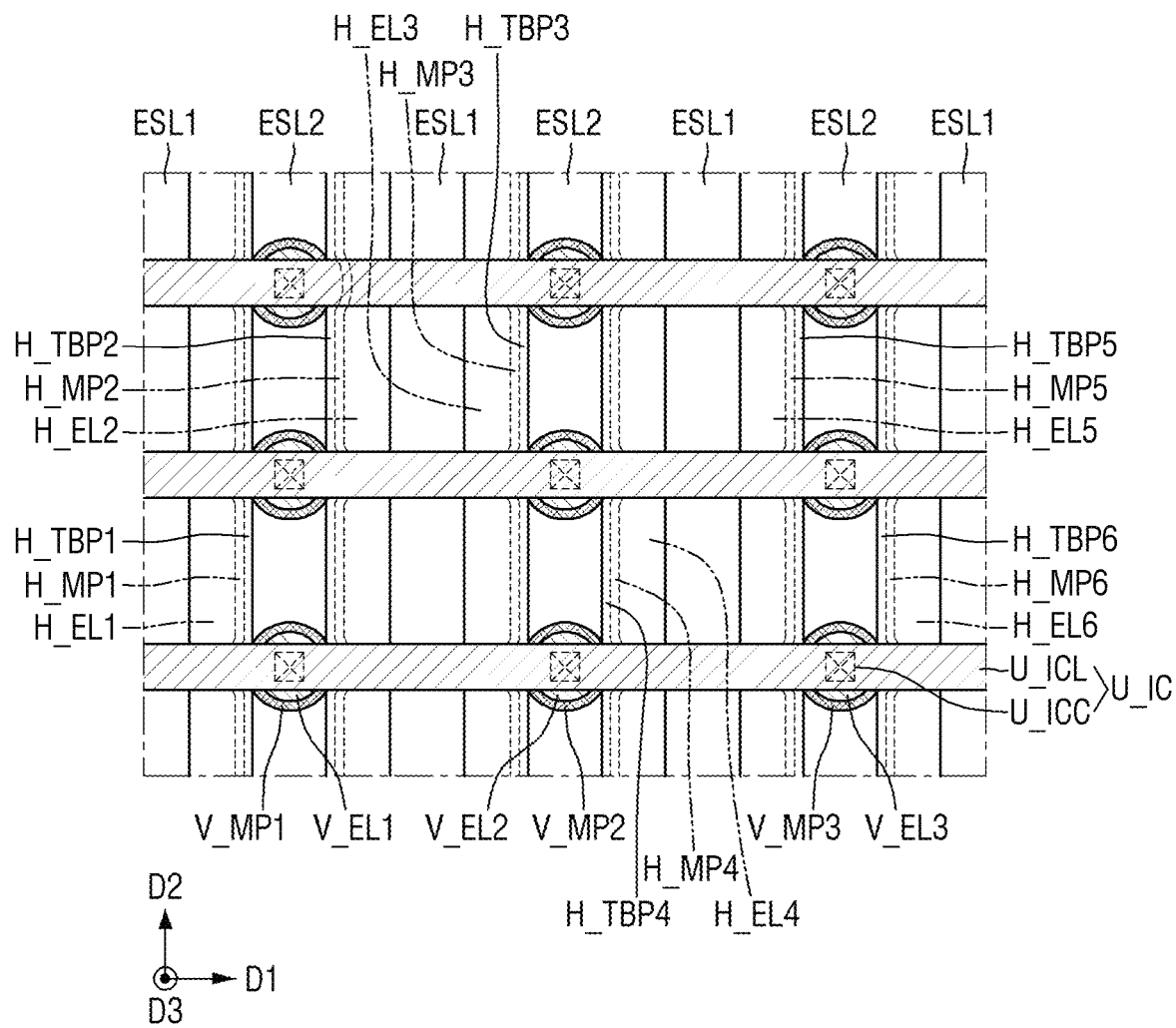
FIG. 11 is a diagram for explaining the semiconductor memory device according to some example embodiments.

FIG. 11 is a diagram for explaining the semiconductor memory device according to some example embodiments. For convenience of explanation, the points different from those explained using FIGS. 4, 5 and 8 will be mainly described.

Referring to FIG. 11, in the semiconductor memory device according to some example embodiments, the cell array may further include fifth and sixth horizontal conductive lines H_EL5 and H_EL6, a third vertical conductive line V_EL3, fifth and sixth horizontal magnetic patterns H_MP5 and H_MP6, a third vertical magnetic pattern V_MP3, fifth and sixth horizontal tunnel barrier patterns H_TBP5 and H_TBP6, and an upper connection structure U_IC.

The fifth and sixth horizontal conductive lines H_EL5 and H_EL6 may be substantially the same as the description of the first and second horizontal conductive lines H_EL1 and H_EL2. The description of the third vertical conductive line V_EL3 may be substantially the same as the description of the first vertical conductive line V_EL1. The description of the fifth and sixth horizontal magnetic patterns H_MP5 and H_MP6 may be substantially the same as the first and second horizontal magnetic patterns H_MP1 and H_MP2. The description of the third vertical magnetic pattern V_MP3 may be substantially the same as the description of the first vertical magnetic pattern V_MP1. The description of the fifth and sixth horizontal tunnel barrier patterns H_TBP5 and H_TBP6 may be substantially the same as the description of the first and second horizontal tunnel barrier patterns H_TBP1 and H_TBP2.

In FIG. 11, the cross-sectional view taken along the upper connection structure U_IC in the first direction D1 may be easily inferred using FIG. 8.

The upper connection structure U_IC may be connected to a first vertical conductive line V_EL1, a second vertical conductive line V_EL2, and a third vertical conductive line V_EL3 arranged in the first direction D1. The upper connection structure U_IC may connect three vertical conductive lines adjacent to each other in the first direction D1.

The upper connection structure U_IC may include an upper connection contact U_ICC and an upper connection wiring U_ICL. The upper connection contact U_ICC may be connected to each of the first vertical conductive line V_EL1, the second vertical conductive line V_EL2, and the third vertical conductive line V_EL3.

The upper connection wiring U_ICL may connect the upper connection contact U_ICC on the first vertical conductive line V_EL1, the upper connection contact U_ICC on the second vertical conductive line V_EL2, and the upper connection contact U_ICC on the third vertical conductive line V_EL3.

For example, the first to third vertical conductive lines V_EL1, V_EL2, and V_EL3 connected to the upper connection wiring U_ICL may each be connected to the peripheral connection pad included in the peripheral circuit region.

Figure 12:
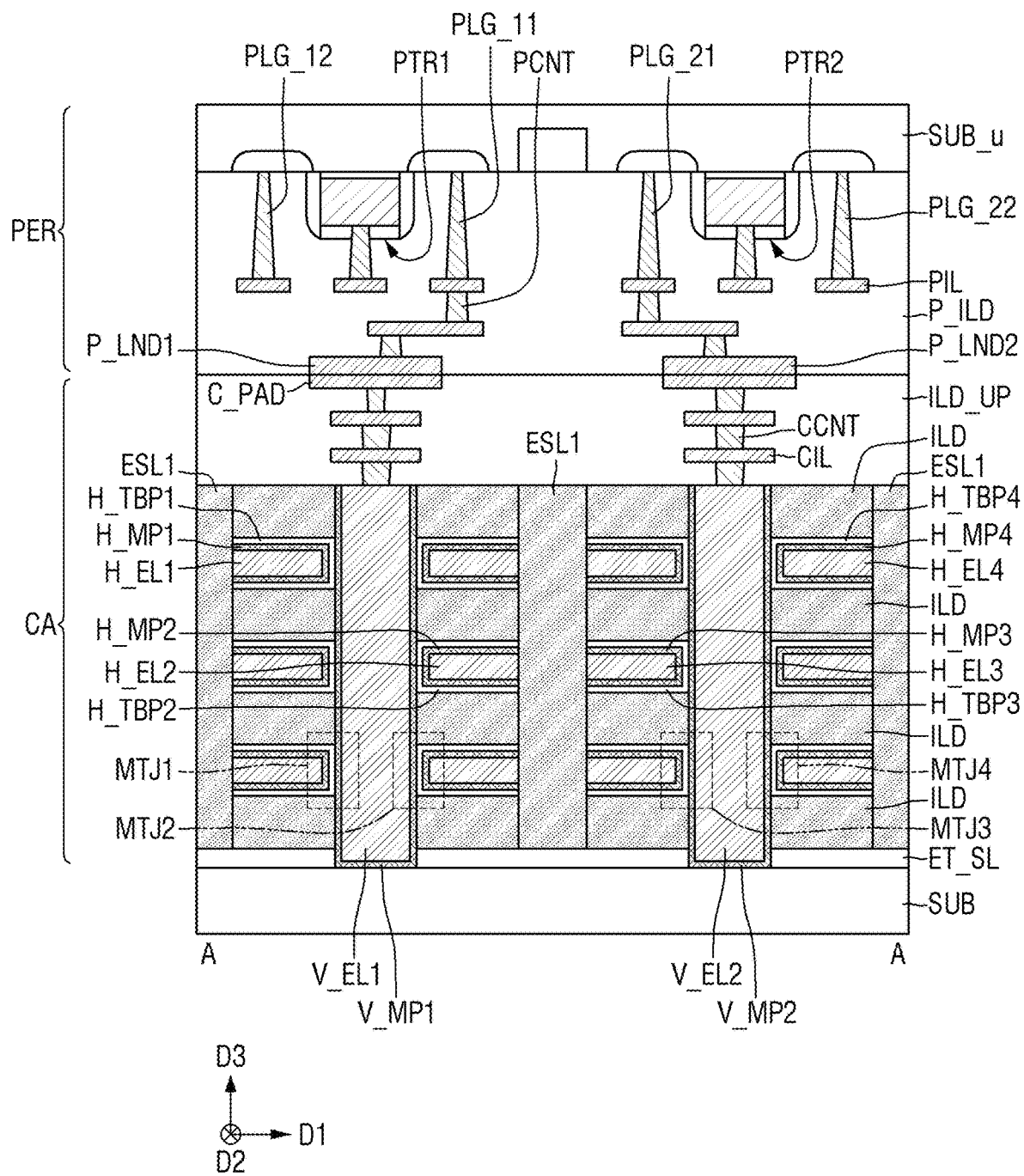
FIG. 12 is a diagram for explaining the semiconductor memory device according to some example embodiments.

FIG. 12 is a diagram for explaining the semiconductor memory device according to some example embodiments. For convenience of explanation, the points different from those explained using FIGS. 4 and 5 will be mainly described.

Referring to FIG. 12, in the semiconductor memory device according to some example embodiments, the cell array CA may include cell array wirings CIL, CONT, and C_PAD placed in the upper interlayer insulating film ILD_UP.

The cell array wiring may include cell wirings CIL connected to the first and second vertical conductive lines V_EL1 and V_EL2 and the first to fourth horizontal conductive lines H_EL1, H_EL2, H_EL3, and H_EL4, and cell contacts PCNT that vertically connect the cell wirings CIL. In addition, the cell array wiring may include a cell connection pad C_PAD connected to the cell wirings CIL and the cell contacts PCNT.

The peripheral circuit region PER may include an upper substrate SUB_u, and peripheral circuits PTR1, PRT2, PIL, PCNT, PLG_11, PLG_12, PLG_21, and PLG_22 that are placed on the upper substrate SUB_u and control the cell array CA. Also, the peripheral circuit region PER may also include peripheral connection pads P_LND1 and P_LND2.

The peripheral circuit region PER and the cell array CA may be wafer-bonded. The peripheral circuits PTR1, PRT2, PIL, PCNT, PLG_11, PLG_12, PLG_21, and PLG_22 may be connected to the first and second vertical conductive lines V_EL1 and V_EL2 and the first to fourth horizontal conductive lines H_EL1, H_EL2, H_EL3, and H_EL4 through the connection between the peripheral connection pads P_LND1 and P_LND2 and the cell connection pad C_PADt.

Example embodiments are not limited to those described above, and the above example embodiments are not necessarily mutually exclusive to one another. For example, some example embodiments may include some features described with reference to one figure, and may further include some features described with reference to another figure.

Figure 13:
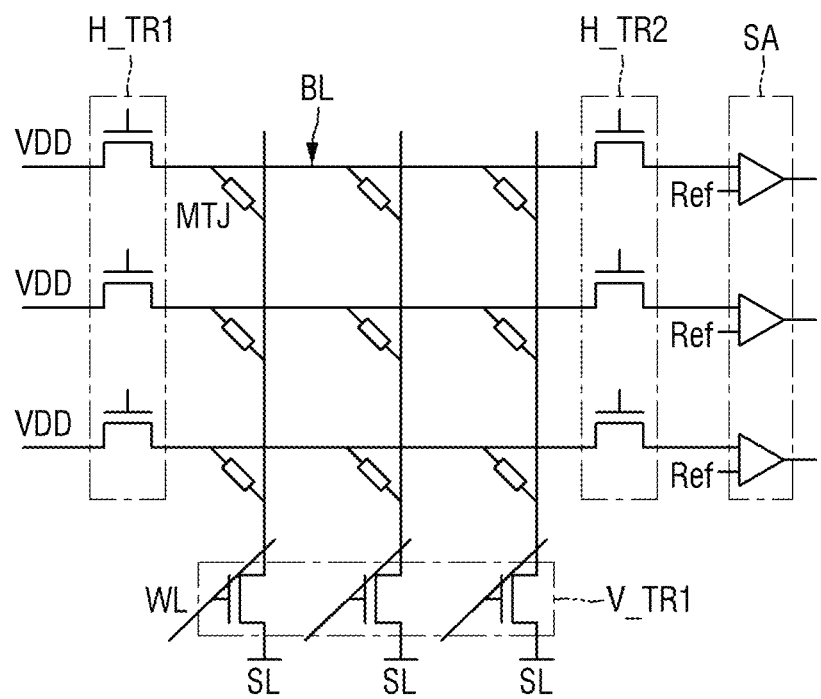
FIG. 13 is a schematic circuit diagram for explaining the semiconductor memory device according to some example embodiments.
Figure 14A:
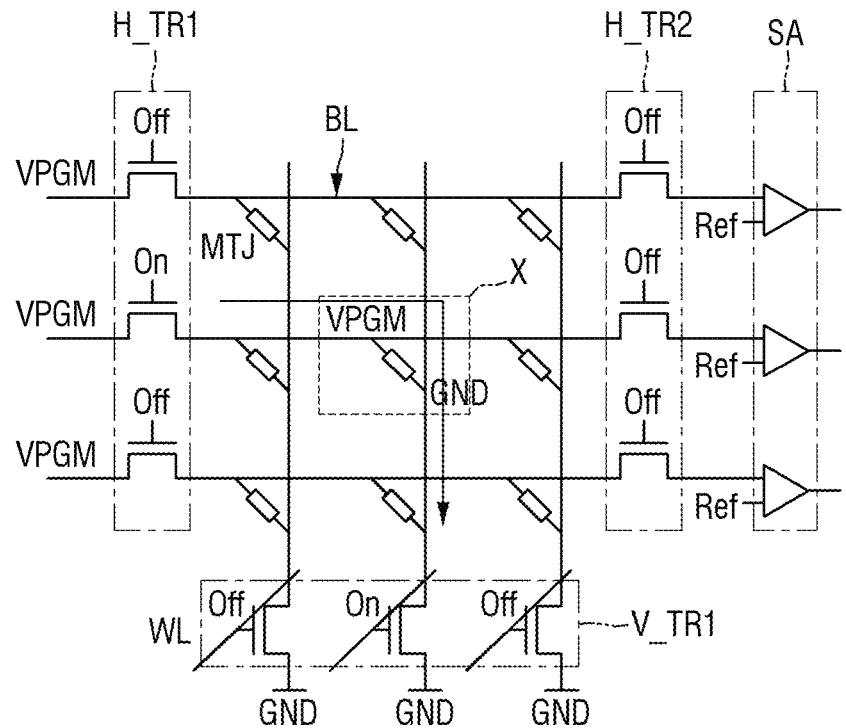
Figure 14B:
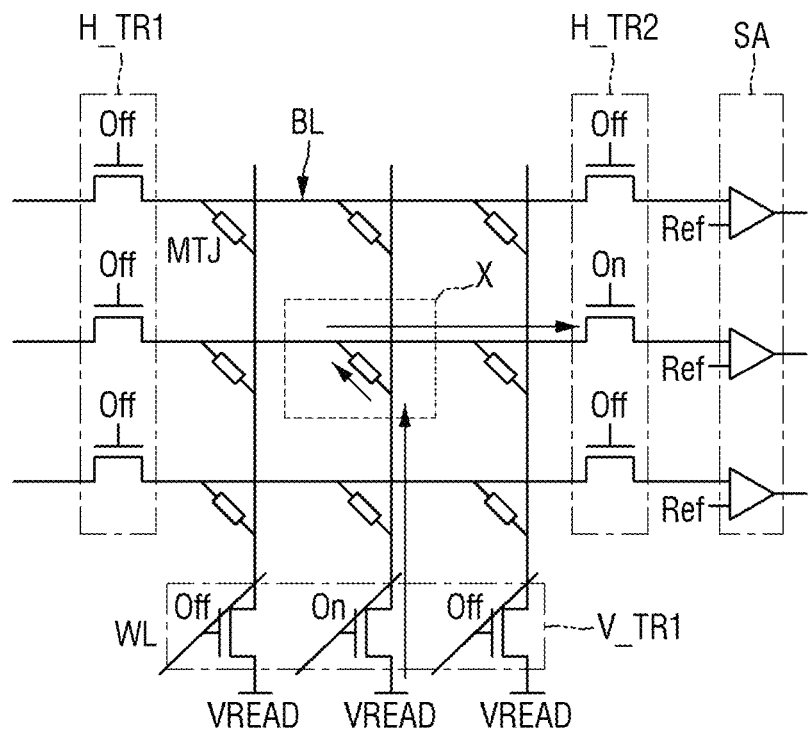
Figure 14C:
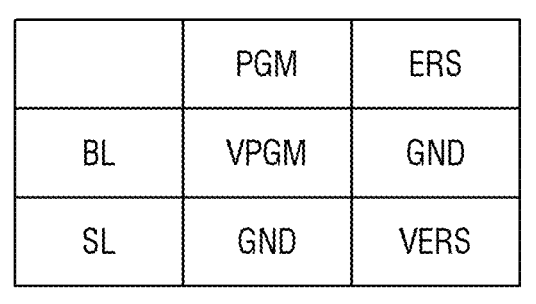

FIG. 13 is a schematic circuit diagram for explaining the semiconductor memory device according to some example embodiments. FIGS. 14A to 14C are diagrams for explaining the example operation of the circuit diagram shown in FIG. 13. The operation described in FIGS. 14A and 14B may be, for example, an example of the operation of an STT (Spin Transfer Torque) MRAM.

For reference, since the description of the operation of the semiconductor memory device described below is merely an example description, the technical idea of the present disclosure is not limited thereto. The transistors described below may be peripheral transistors PTR1 and PTR2 included in the peripheral circuit region (PER of FIGS. 1 to 12), and may or may not be NMOS transistors (e.g. planar NMOS transistors).

Referring to FIG. 13, a first source/drain region (e.g. a source region) of the first vertical transistor V_TR1 is connected to the source line SL, and a second source/drain region (e.g. a drain region) of the first vertical transistor V_TR1 is connected to the vertical conductive line of FIGS. 1 to 12. A gate of the first vertical transistor V_TR1 is connected to the word line WL or the word line WL. For example, one end of the vertical conductive line of FIGS. 1 to 12 is connected to the first vertical transistor V_TR1. However, the other end of the vertical conductive line of FIGS. 1 to 12 may be in a floating state.

The first source/drain region of the first horizontal transistor H_TR1 is connected to the power supply terminal VDD, and the second source/drain region of the first horizontal transistor H_TR1 is connected to a horizontal conductive line of FIGS. 1 to 12. For example, the horizontal conductive line of FIGS. 1 to 12 may be connected to the bit lines (e.g. column lines).

The first source/drain region of the second horizontal transistor H_TR2 is connected to the horizontal conductive line of FIGS. 1 to 12, and the second source/drain region of the second horizontal transistor H_TR2 is connected to a sensing amplifier SA.

For example, one end of the horizontal conductive line of FIGS. 1 to 12 is connected to the first horizontal transistor H_TR1. The other end of the horizontal conductive line of FIGS. 1 to 12 is connected to the second horizontal transistor H_TR2.

A magnetic tunnel junction (MTJ) is placed at an intersection point between the vertical conductive line and the horizontal conductive line of FIGS. 1 to 12.

A writing operation PGM (e.g. an operation to store a logical '0') and an erasing operation ERS (e.g. an operation to store a logical '1') of the magnetic tunnel junction (MTJ) placed in the region X will be explained, using FIGS. 14A and 14C.

A gate of one of the first vertical transistor V_TR1 connected to the magnetic tunnel junction (MTJ) of the region X is turned on (ON), and the gates of the remaining first vertical transistors V_TR1 are turned off (Off).

Additionally, the gate of one of the first horizontal transistor H_TR1 connected to the magnetic tunnel junction (MTJ) of the region X is turned on (ON), and the gates of the remaining first horizontal transistors H_TR1 are turned off (Off). In addition, all gates of the second horizontal transistor H_TR2 are turned off (Off).

A program voltage VPGM is applied to the first source/drain region of the first horizontal transistor H_TR1, and a ground voltage GND is applied to the first source/drain region of the first vertical transistor V_TR1. When operated in this way, the writing operation is performed on the magnetic tunnel junction (MTJ) of the region X.

Alternatively, the ground voltage GND is applied to the first source/drain region of the first horizontal transistor H_TR1, and an erasing voltage VERS is applied to the first source/drain region of the first vertical transistor V_TR1. When operated in this way, the erasing operation is performed on the magnetic tunnel junction (MTJ) of the region X. A sign of the erasing voltage VERS is opposite to a sign of the program voltage VPGM. For example, if the program voltage VPGM is a positive voltage, the erasing voltage VERS is a negative voltage.

The reading operation of the magnetic tunnel junction (MTJ) placed in the region X will be explained, using FIG. 14B.

The gate of the first vertical transistor V_TR1 connected to the magnetic tunnel junction (MTJ) of the region X is turned on (ON), and the gates of the remaining first vertical transistors V_TR1 are turned off (Off).

Additionally, the gate of the second horizontal transistor H_TR2 connected to the magnetic tunnel junction (MTJ) of the region X is turned on (ON), and the gate of the remaining second horizontal transistors H_TR2 are turned off (Off). Furthermore, all gates of the first horizontal transistor H_TR1 are turned off (Off).

When the reading voltage VREAD is applied to the first source/drain region of the first vertical transistor V_TR1, current may flow along a path of an arrow. The data stored in the magnetic tunnel junction (MTJ) of the region X may be read accordingly.

Unlike the shown configuration, all the gates of the second horizontal transistor H_TR2 connected to the sensing amplifier SA may be turned on (ON). In such a case, when the first vertical transistor V_TR1 that is turned on (ON) is connected to the first vertical conductive line, data of the plurality of magnetic tunnel junctions MTJ connected to the first vertical conductive lines may be read at the same time.

Figure 15:
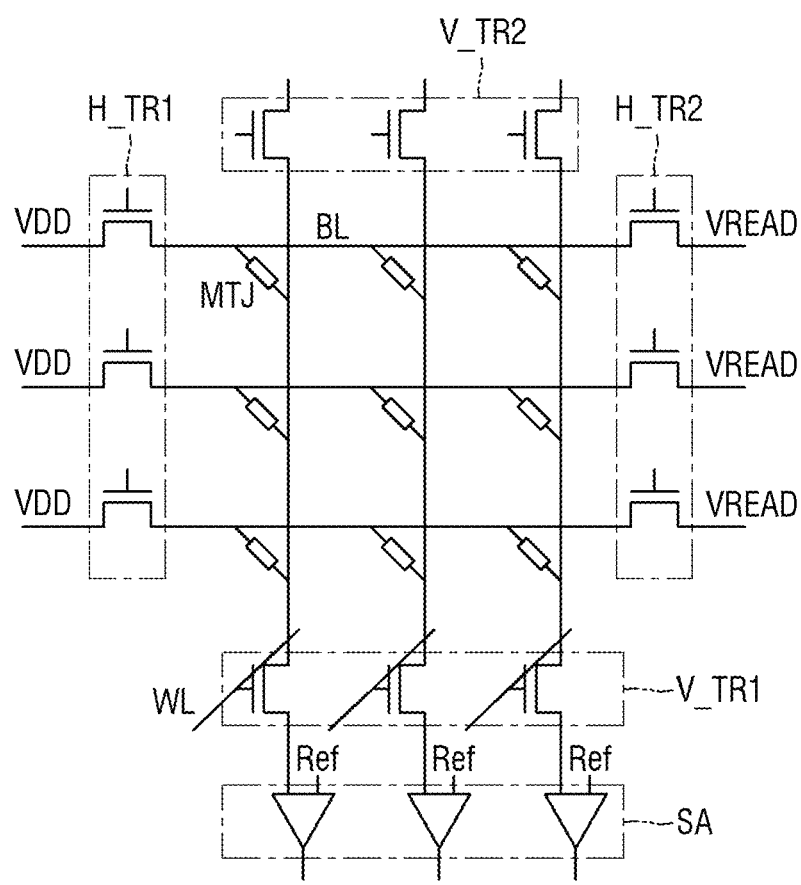
FIG. 15 is a schematic circuit diagram for explaining the semiconductor memory device according to some example embodiments.
Figure 16A:
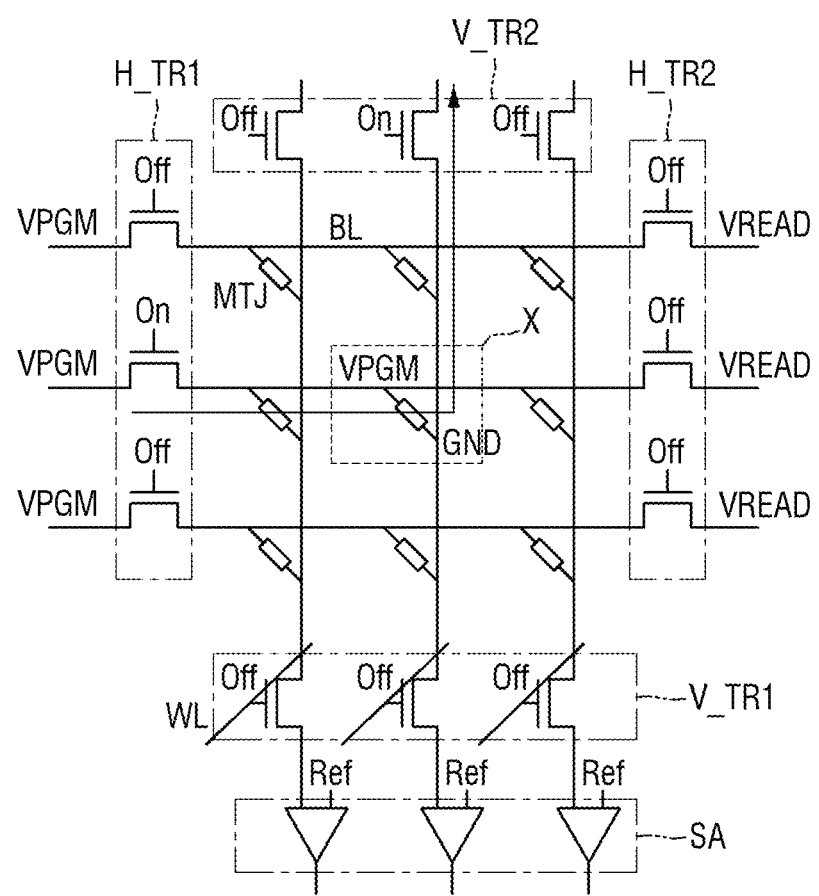
FIGS. 16A and 16B are diagrams for showing an example operation of the circuit diagram shown in FIG. 15.
Figure 16B:
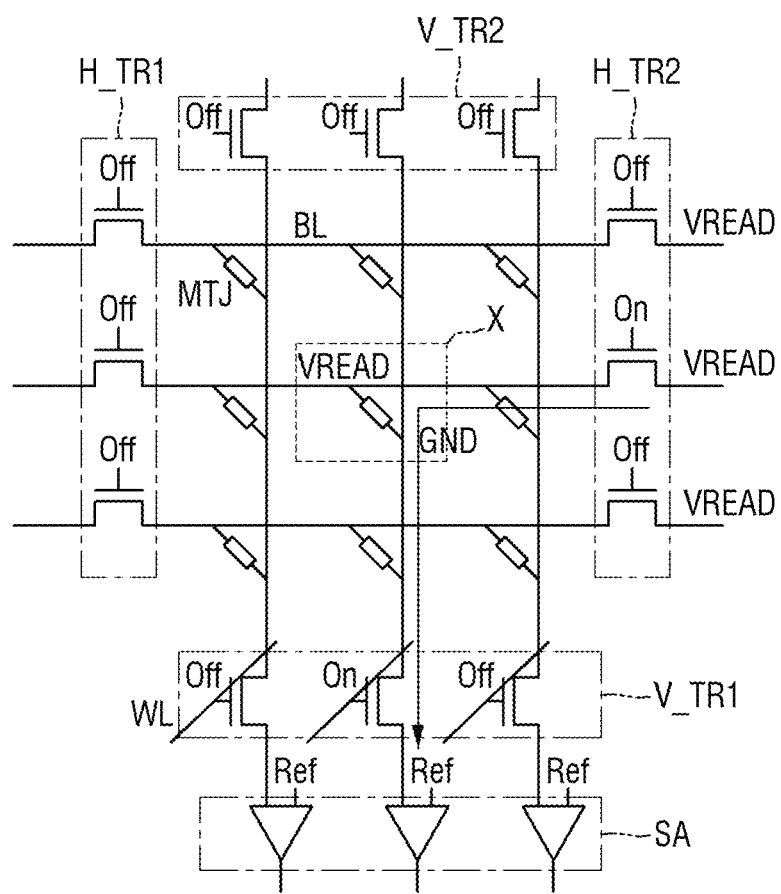

FIG. 15 is a schematic circuit diagram for explaining the semiconductor memory device according to some example embodiments. FIGS. 16A and 16B are diagrams for showing example operation of the circuit diagram shown in FIG. 15. For convenience of explanation, the points different from those explained using FIGS. 13 to 14C will be mainly described. The operations described in FIGS. 16A and 16B may be, for example, examples of the operation of the STT-MRAM.

Referring to FIG. 15, the first vertical transistor V_TR1 is connected to one end of the vertical conductive line of FIGS. 1 to 12, and the second vertical transistor V_TR2 is connected to the other end of the vertical conductive line of FIGS. 1 to 12.

The sensing amplifier SA is connected to the first vertical transistor V_TR1.

The writing operation PGM and the erasing operation ERS of the magnetic tunnel junction (MTJ) placed in the region X will be explained using FIGS. 14C and 16A.

The gate of the second vertical transistor V_TR2 connected to the magnetic tunnel junction (MTJ) of the region X is turned on (ON), and the gate of the remaining second vertical transistor V_TR2 is turned off (Off). All gates of the first vertical transistor V_TR1 are turned off (Off).

Also, the gate of the first horizontal transistor H_TR1 connected to the magnetic tunnel junction (MTJ) of the region X is turned on (ON), and the gates of the remaining first horizontal transistors H_TR1 are turned off (Off). In addition, all gates of the second horizontal transistor H_TR2 are turned off (Off).

The program voltage VPGM is applied to the first source/drain region of the first horizontal transistor H_TR1, and the ground voltage GND is applied to the source/drain region of the second vertical transistor V_TR1 that is turned on. When operated in this way, the writing operation may be performed on the magnetic tunnel junction (MTJ) of the region X.

Unlike this, the ground voltage GND is applied to the first source/drain region of the first horizontal transistor H_TR1, and the erasing voltage VERS is applied to the source/drain region of the second vertical transistor V_TR1 that is turned on. When operated in this way, the erasing operation is performed on the magnetic tunnel junction (MTJ) of the region X.

In FIG. 16B, the reading operation of the magnetic tunnel junction (MTJ) placed in the region X will be explained.

The gate of the first vertical transistor V_TR1 connected to the magnetic tunnel junction (MTJ) of the region X is turned on (ON), and the gate of the remaining first vertical transistor V_TR1 is turned off (Off). All gates of the second vertical transistor V_TR2 are turned-off (Off).

Also, the gate of the second horizontal transistor H_TR2 connected to the magnetic tunnel junction (MTJ) of the region X is turned on (ON), and the gates of the remaining second horizontal transistors H_TR2 is turned off (Off). In addition, all gates of the first horizontal transistor H_TR1 are turned off (Off).

When the reading voltage VREAD is applied to the source/drain region of the second horizontal transistor H_TR2, current may flow along the path of the arrow. The data stored in the magnetic tunnel junction (MTJ) of the region X may be read accordingly.

Unlike the shown configuration, all gates of the first vertical transistor V_TR1 connected to the sensing amplifier SA may be turned on (ON). In such a case, when the second horizontal transistor H_TR2 that is turned on (ON) is connected to the second horizontal conductive line, data of the plurality of magnetic tunnel junctions (MTJ) connected to the second horizontal conductive line may be read at the same time.

Figure 17:
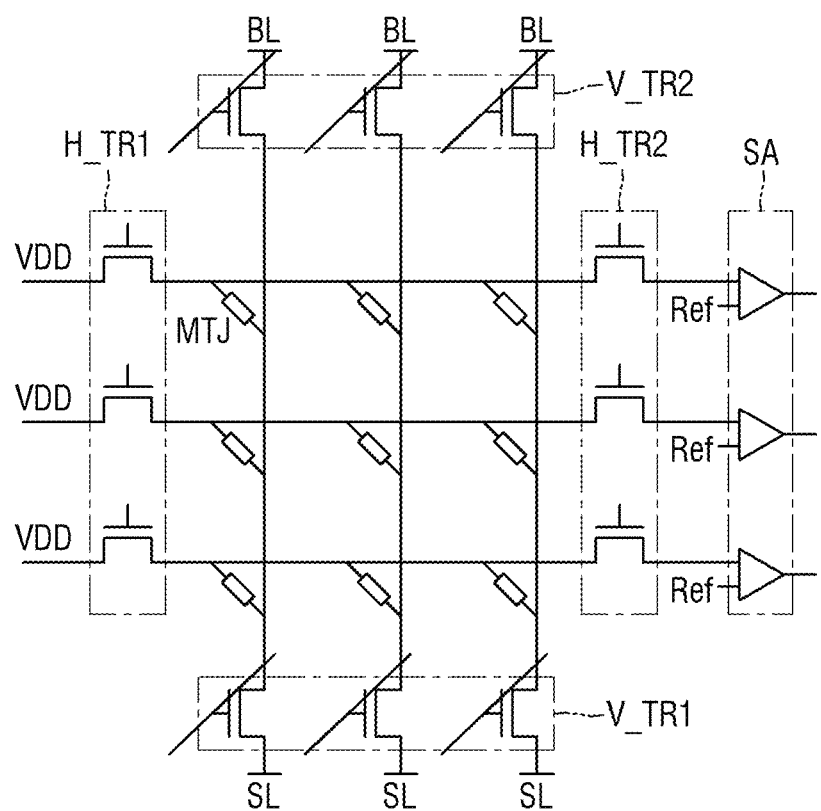
FIG. 17 is a schematic circuit diagram for explaining the semiconductor memory device according to some example embodiments.
Figure 18A:
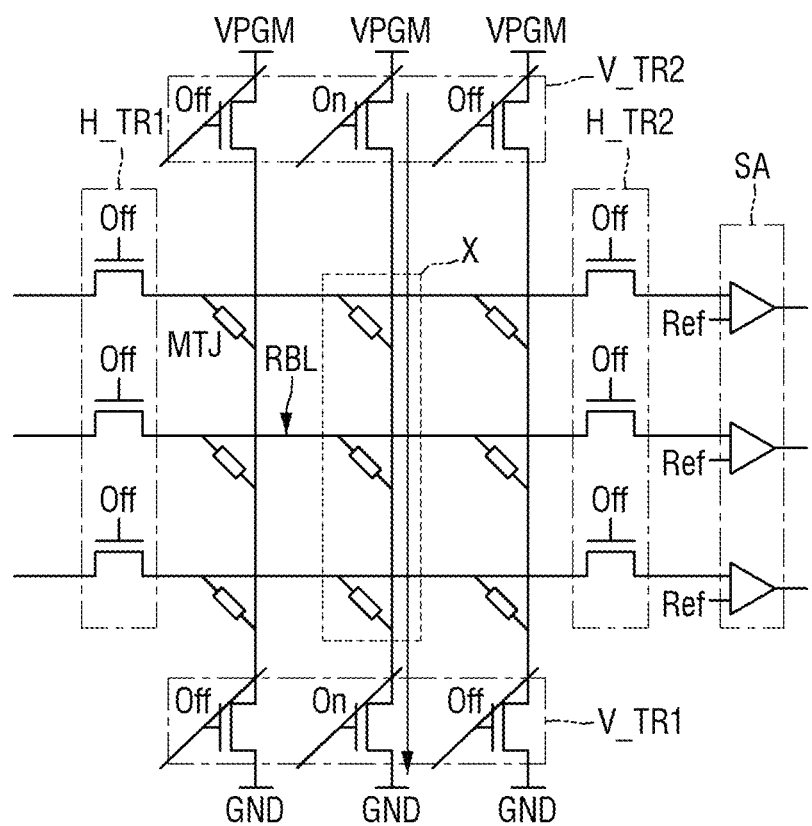
FIGS. 18A to 18C are diagrams for explaining the example operation of the circuit diagram shown in FIG. 17.
Figures 18B, 18C:
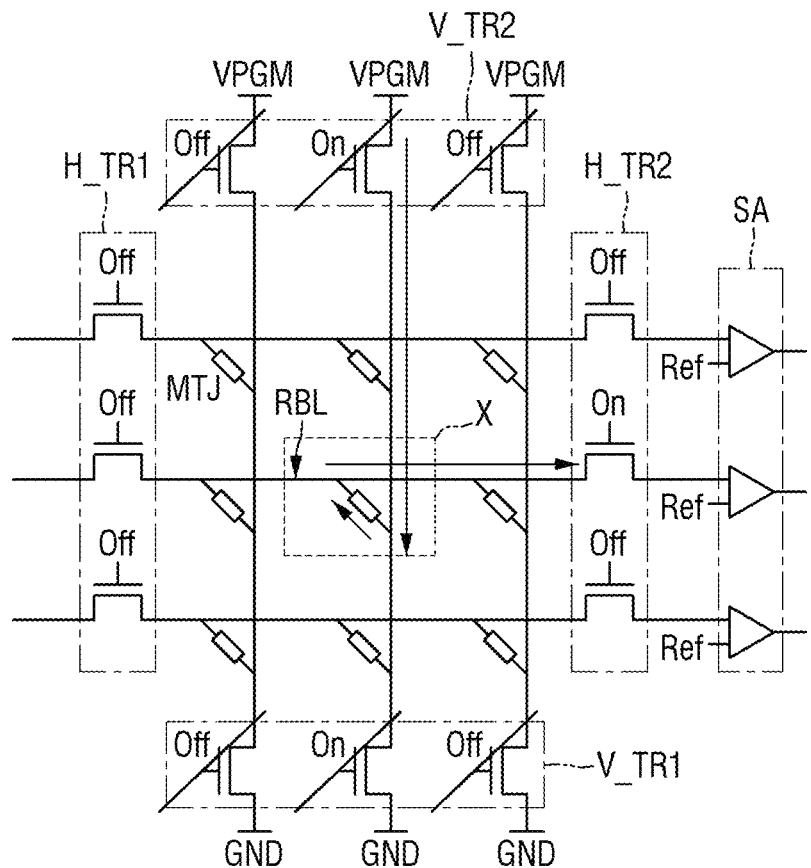

FIG. 17 is a schematic circuit diagram for explaining the semiconductor memory device according to some example embodiments. FIGS. 18A to 18C are diagrams for explaining the example operation of the circuit diagram shown in FIG. 17. For convenience of explanation, the points different from those explained using FIGS. 13 to 14C will be mainly described. The operations described in FIGS. 18A and 18B may be, for example, examples of the operation of a SOT (Spin-Orbit Torque) MRAM.

Referring to FIG. 17, the first source/drain region of the second vertical transistor V_TR2 is connected to the bit line BL, and the second source/drain region of the second vertical transistor V_TR2 is connected to the vertical conductive line shown of FIGS. 1 to 12.

In another way, one end of the vertical conductive line of FIGS. 1 to 12 is connected to the first vertical transistor V_TR1, and the other end of the vertical conductive line of FIGS. 1 to 12 is connected to the second vertical transistor V_TR2.

The horizontal conductive line of FIGS. 1 to 12 may be a reading bit line RBL.

The writing operation PGM and the erasing operation ERS of the magnetic tunnel junction (MTJ) placed in the region X will be explained, using FIGS. 18A and 18C.

The gate of the first horizontal transistor H_TR1 and the gate of the second horizontal transistor H_TR2 are all turned off (Off). The gate of the first vertical transistor V_TR1 connected to the magnetic tunnel junction (MTJ) of the region X is turned on (ON), and the gates of the remaining first vertical transistors V_TR1 are turned off (Off). Also, the gate of the second vertical transistor V_TR2 connected to the magnetic tunnel junction (MTJ) of the region X is turned on (ON), and the gate of the remaining second vertical transistor V_TR2 is turned off (Off).

The program voltage VPGM is applied to the bit line BL connected to the second vertical transistor V_TR2, and the ground voltage GND is applied to the source line SL connected to the first vertical transistor V_TR1. At this time, a current flows along the path of the arrow. When operated in this way, the writing operation is performed on the magnetic tunnel junction (MTJ) of the region X.

The writing operation may be performed at once on the magnetic tunnel junction (MTJ) connected to the vertical conductive line connected to the first vertical transistor V_TR1 and the second vertical transistor V_TR2 which are turned on (ON).

Unlike this, the ground voltage GND is applied to the bit line BL connected to the second vertical transistor V_TR2, and the program voltage VPGM is applied to the source line SL connected to the first vertical transistor V_TR1. When operated in this way, the erasing operation is performed on the magnetic tunnel junction (MTJ) of the region X.

The reading operation READ of the magnetic tunnel junction (MTJ) will be explained using FIG. 18B.

The gate of the first horizontal transistor H_TR1 and the gate of the first vertical transistor V_TR1 are all turned off (Off). The gate of the second vertical transistor V_TR2 connected to the magnetic tunnel junction (MTJ) of the region X is turned on (ON), and the gates of the remaining second vertical transistors V_TR2 are turned off (Off). Also, the gate of the second horizontal transistor H_TR2 connected to the magnetic tunnel junction (MTJ) of the region X is turned on (ON), and the gate of the remaining second horizontal transistor H_TR2 is turned off (Off).

When the reading voltage VREAD is applied to the bit line BL connected to the second vertical transistor V_TR2, a current may flow along the path of the arrow. The data stored in the magnetic tunnel junction (MTJ) of the region X may be read accordingly. At this time, the voltage of the reading bit line RBL connected to the magnetic tunnel junction (MTJ) of the region X may be the ground voltage GND.

Alternatively, when the program voltage VPGM is applied to the bit line BL connected to the second vertical transistor V_TR2, a current may flow along the path of the arrow. The data stored in the magnetic tunnel junction (MTJ) of the region X may be read accordingly. At this time, the voltage of the reading bit line RBL connected to the magnetic tunnel junction (MTJ) of the region X may be a half program voltage VPGM/2.

Unlike the shown configuration, all gates of the second horizontal transistor H_TR2 connected to the sensing amplifier SA may be turned on (ON). In such a case, when the second vertical transistor V_TR2 which is turned on (ON) is connected to the first vertical conductive line, data of the plurality of magnetic tunnel junctions (MTJ) connected to the first vertical conductive line may be read at the same time.

In FIGS. 17 to 18B, unlike the aforementioned configuration, one end of the vertical conductive line of FIGS. 1 to 12 is connected to the first horizontal transistor H_TR1, and the other end of the vertical conductive line of FIGS. 1 to 12 may be connected to the first horizontal transistor H_TR2. Further, one end of the horizontal conductive line of FIGS. 1 to 12 is connected to the first vertical transistor V_TR1, and the other end of the horizontal conductive line of FIGS. 1 to 12 may be connected to the first vertical transistor V_TR2. In such a case, the vertical conductive line of FIGS.

1 to 12 may be a reading bit line RBL. However, the contents related to the operation may be the same as those described above.

FIGS. 19A to 23 are intermediate stage diagrams for explaining a method for fabricating the semiconductor memory device according to some example embodiments. For reference, FIGS. 19A to 23 may be a method for fabricating the semiconductor memory device shown in FIGS. 4 and 5.

Figure 19A:
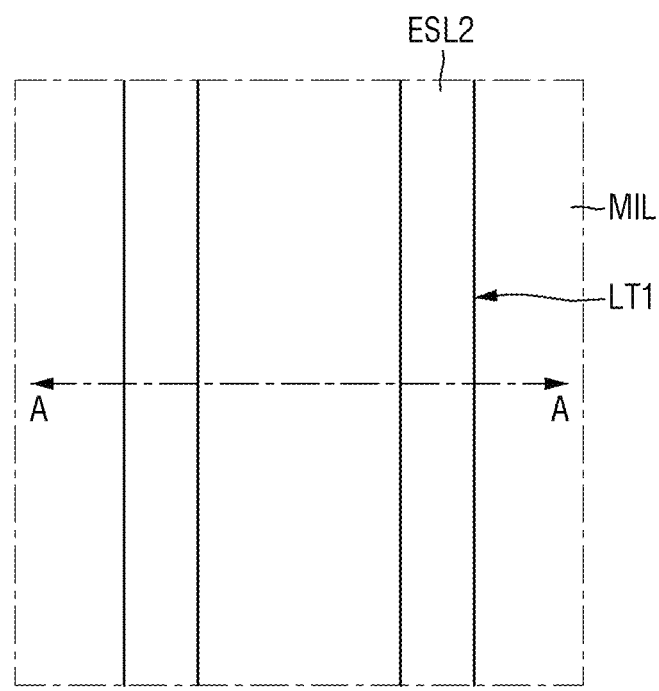
FIGS. 19A to 23 are intermediate stage diagrams for explaining a method for fabricating the semiconductor memory device according to some example embodiments.
Figure 19A:
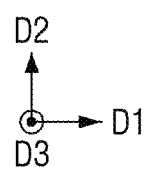
Figure 19B:
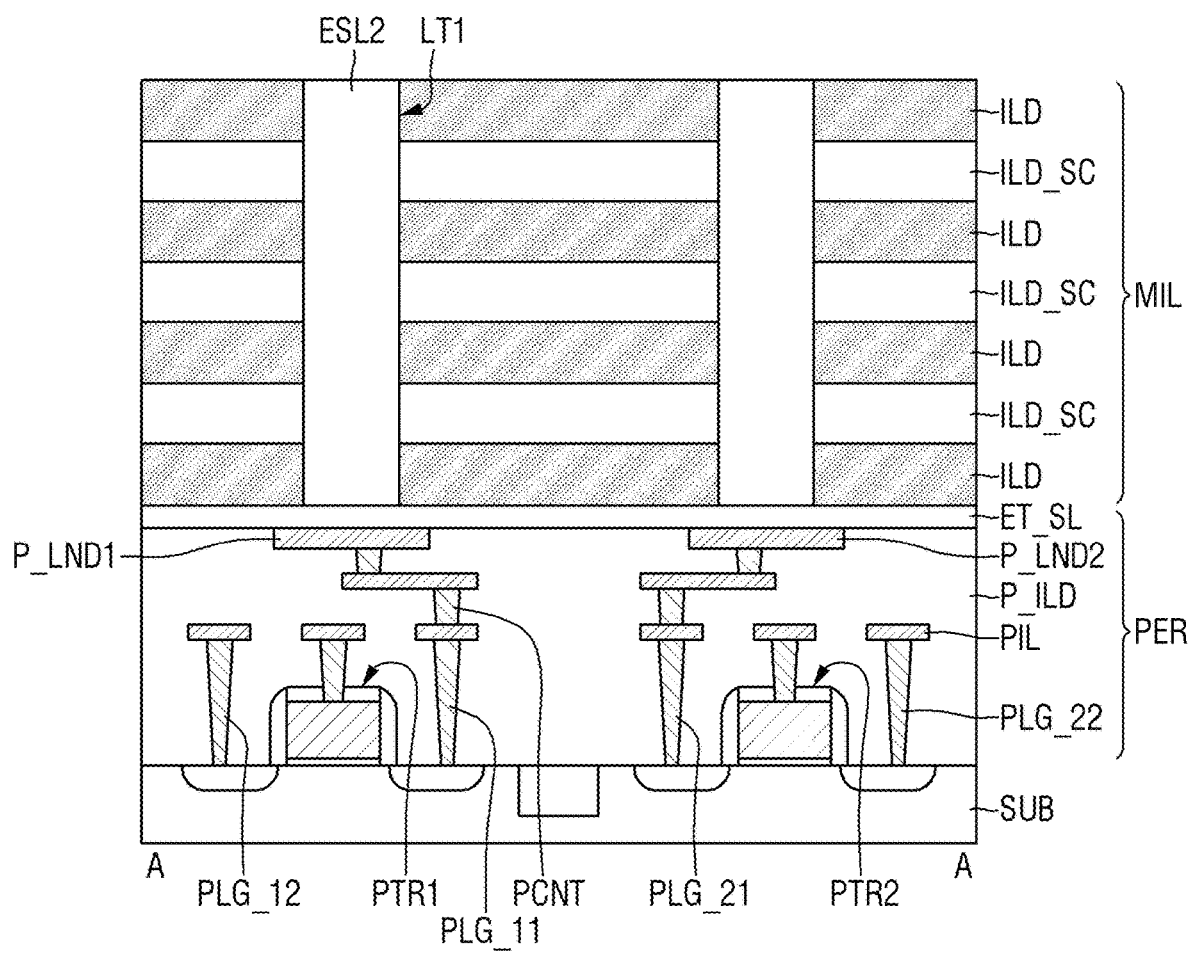

Referring to FIGS. 19A and 19B, a peripheral circuit region PER is formed on the substrate SUB, e.g. may be formed with a front-end-of-line planar transistor process. An etching stop film ET_SL and a mold structure MIL may be formed on the peripheral circuit region PER, e.g. may be formed with a chemical vapor deposition (CVD) process.

The mold structure MIL may include a plurality of vertically stacked mold insulating layers ILD and sacrificial mold insulating layers ILD_SC. The mold insulating layers ILD and the sacrificial mold insulating layers ILD_SC may include, for example, at least one of a silicon oxide film, a silicon nitride film, a silicon oxynitride film, a carbon-including silicon oxide film, a carbon-including silicon nitride film, and a carbon-including silicon oxynitride film. As an example, the mold insulating layer ILD may include a silicon oxide film, and the sacrificial mold insulating layer ILD_SC may include a silicon nitride film. For example, the mold structure MIL may be or may include an ON (oxide/nitride) mold structure.

A first linear trench LT1 that penetrates the mold structure MIL may be formed. The first linear trench LT1 may be in the form of a line extending long in the second direction D2.

Although the first linear trench LT1 is shown as not penetrating the etching stop film ET_SL, the embodiment is not limited thereto. Unlike the shown configuration, the first linear trench LT1 may penetrate the etching stop film ET_SL to expose the peripheral connection pads P_LND1 and P_LND2.

Subsequently, the second electrode separation pattern ESL2 may be formed inside the first linear trench LT1. The second electrode separation pattern ESL2 fills the first linear trench LT1. For example, the second electrode separation pattern ESL2 may include an insulating material having an etching selectivity of the sacrificial mold insulating layer ILD_SC.

Figure 20A:
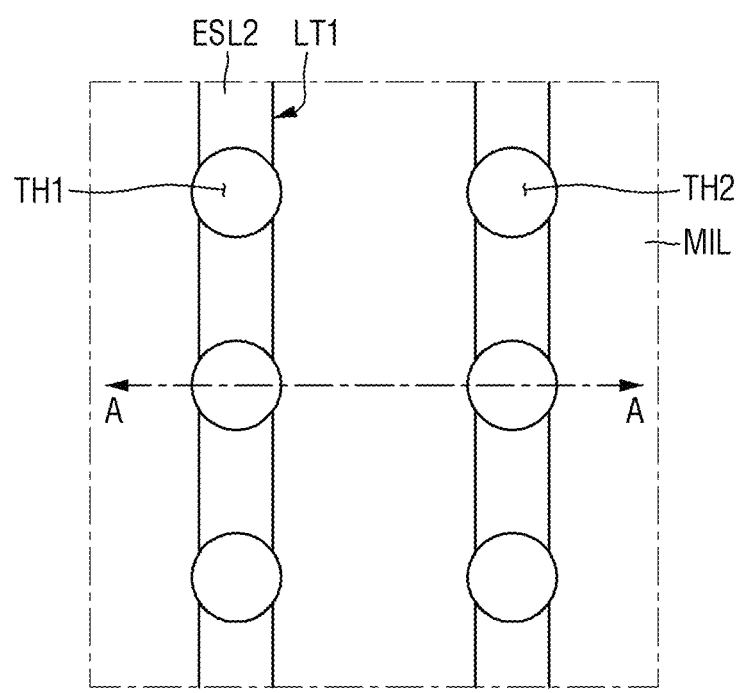
Figure 20B:
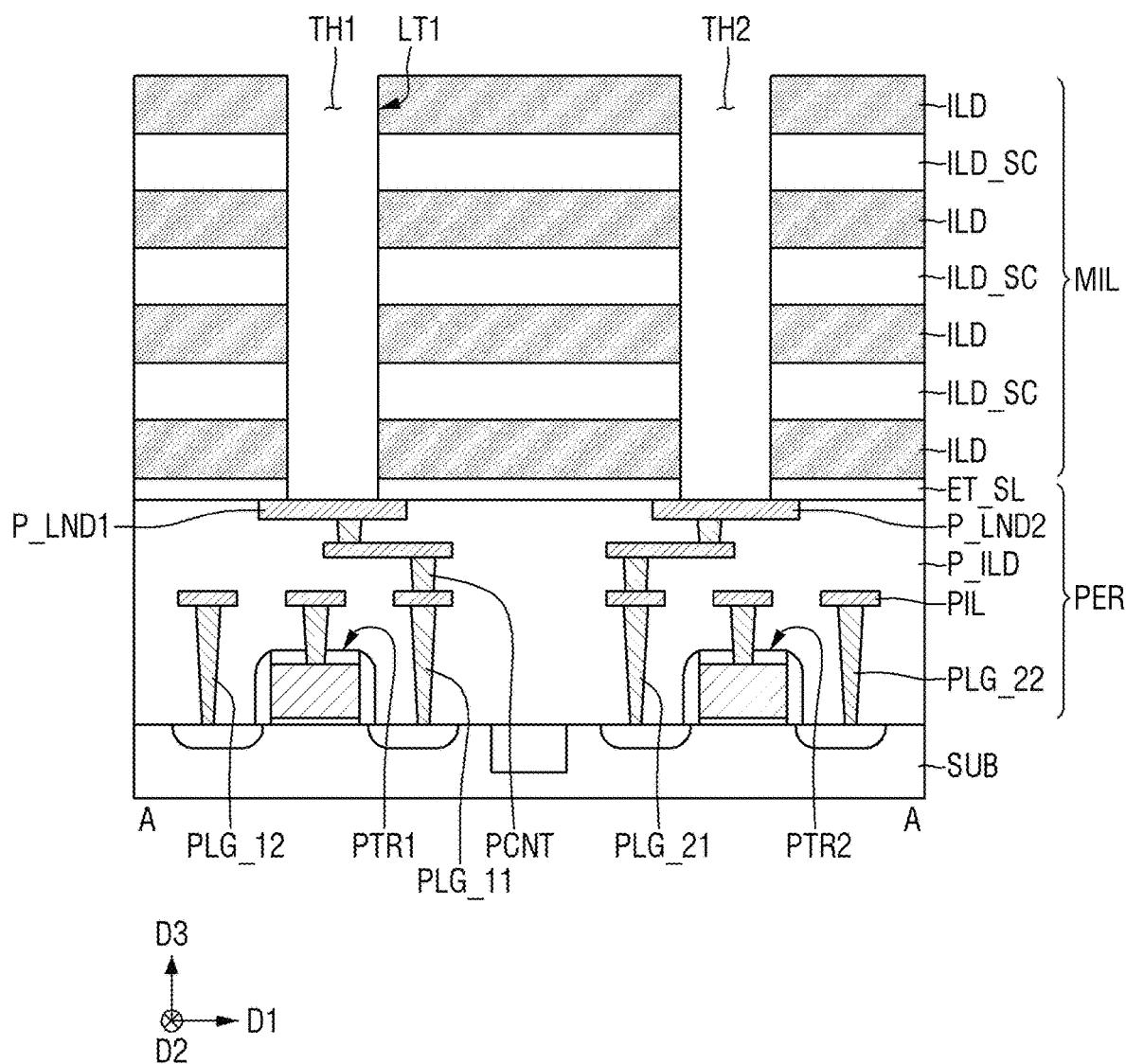

Referring to FIGS. 20A and 20B, first and second holes TH1 and TH2 may be formed along the second electrode separation pattern ESL2. The first and second holes TH1 and TH2 may be a contact type. The first and second holes TH1 and TH2 may have an elliptical contour, such as a circular contour, when viewed in a plan view; however, example embodiments are not limited thereto.

The first and second holes TH1 and TH2 may penetrate a part of the second electrode separation pattern ESL2 and the mold structure MIL. The first and second holes TH1 and TH2 may expose the peripheral connection pads P_LND1 and P_LND2.

The first holes TH1 may be arranged along the second direction D2. The second holes TH2 may be arranged along the second direction D2. The first holes TH1 and the second holes TH2 may be spaced apart from each other in the first direction D1.

Figure 21:
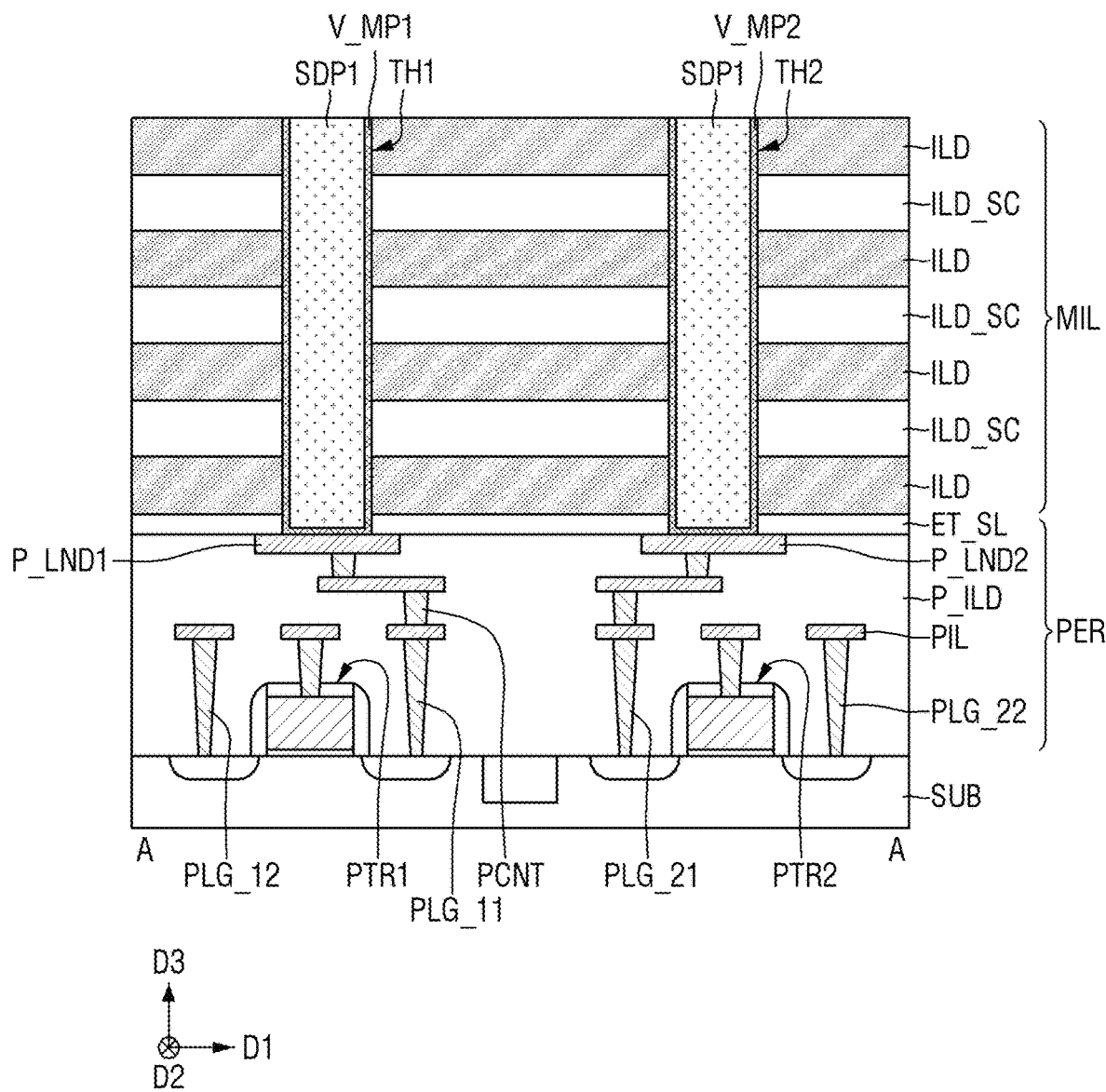

Referring to FIG. 21, the first vertical magnetic pattern V_MP1 may be formed along the side walls and bottom face of the first hole TH1. The second vertical magnetic pattern V_MP2 may be formed along the side walls and bottom face of the second hole TH2.

Subsequently, a first sacrificial pattern SDP1 that fills the first and second holes TH1 and TH2 may be formed on the first vertical magnetic pattern V_MP1 and the second vertical magnetic pattern V_MP2.

Unlike those shown, the first vertical magnetic pattern V_MP1 and the second vertical magnetic pattern V_MP2 are formed on the side walls of the first and second holes TH1 and TH2, but may not be formed on the bottom faces of the first and second holes TH1 and TH2.

Figure 22A:
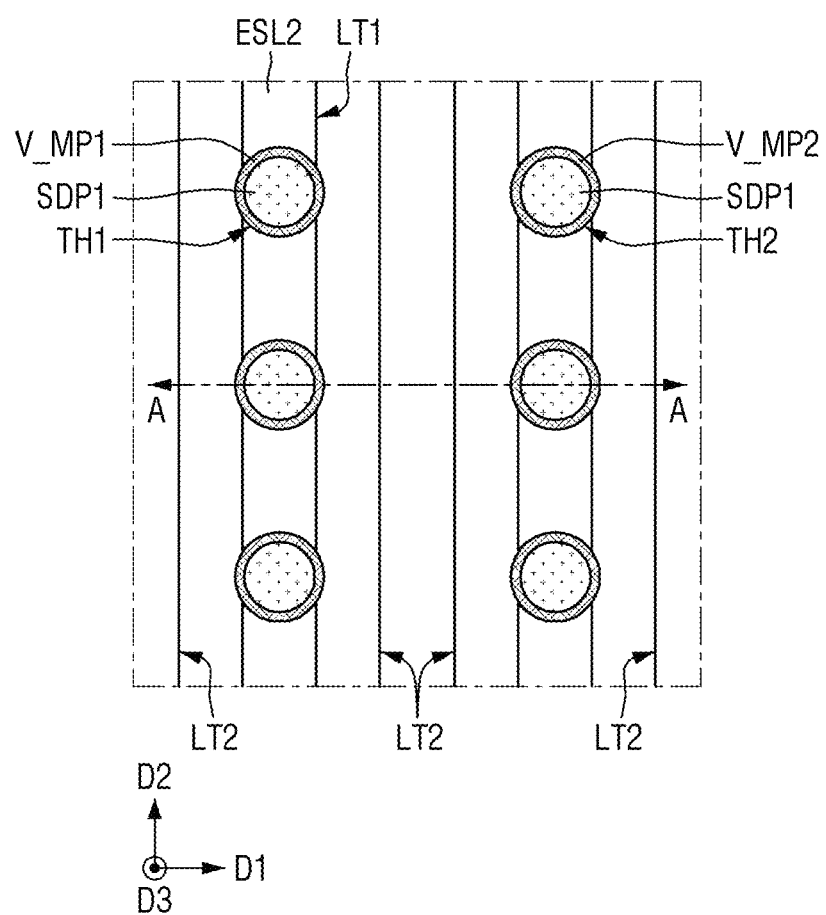
Figure 22B:
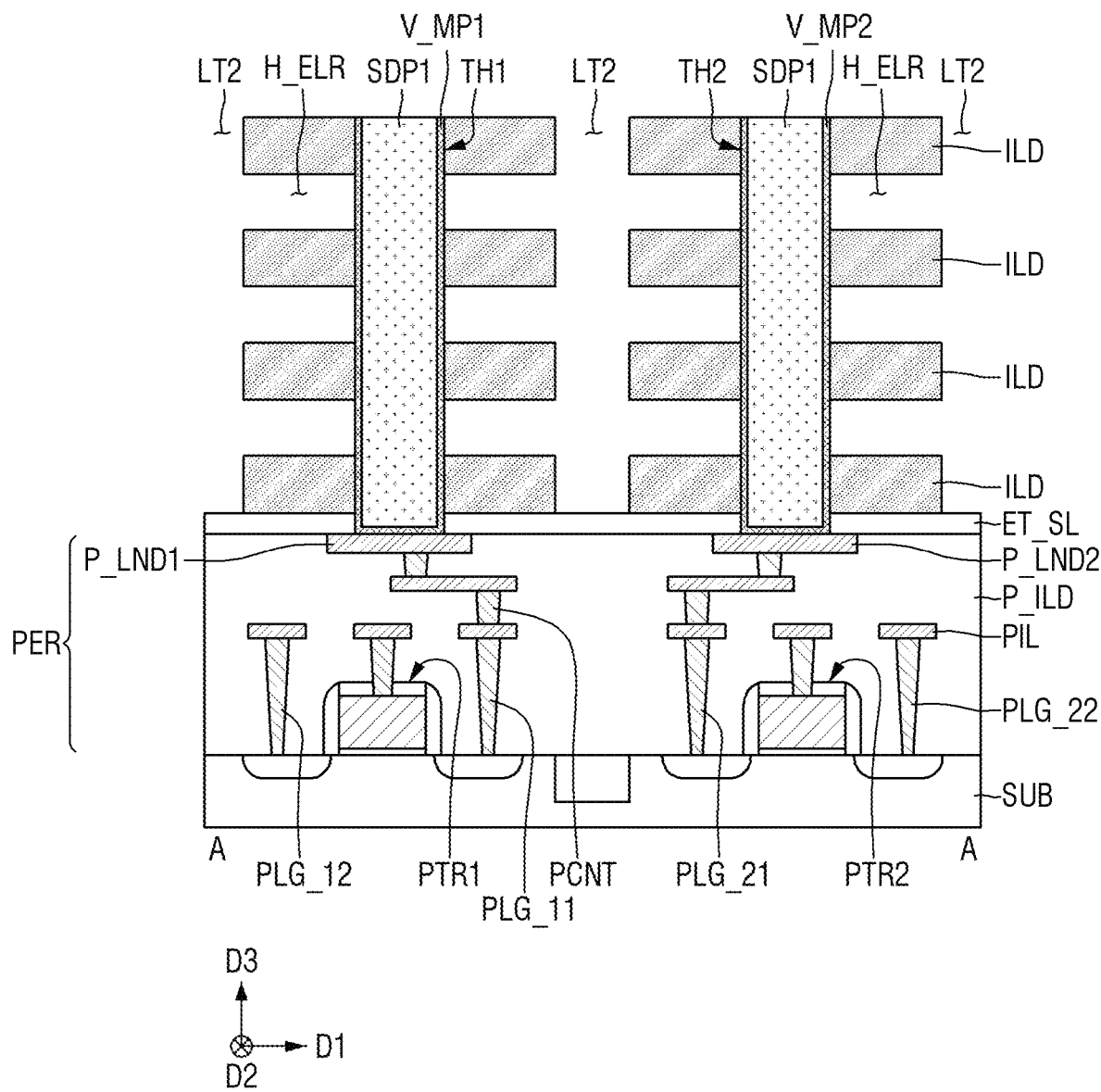

Referring to FIGS. 22A and 22B, a second linear trench LT2 that penetrates the mold structure MIL may be formed. The second linear trench LT2 may be in the form of a line extending long in the second direction D2.

The second linear trench LT2 is formed side by side with the second electrode separation pattern ESL2. The second linear trench LT2 is formed between the second electrode separation patterns ESL2 adjacent to each other in the first direction D1.

Subsequently, the sacrificial mold insulating layer ILD_SC exposed by the second linear trench LT2 may be removed, e.g. may be removed with a wet etching process, to form a horizontal electrode recess H_ELR.

Figure 23:
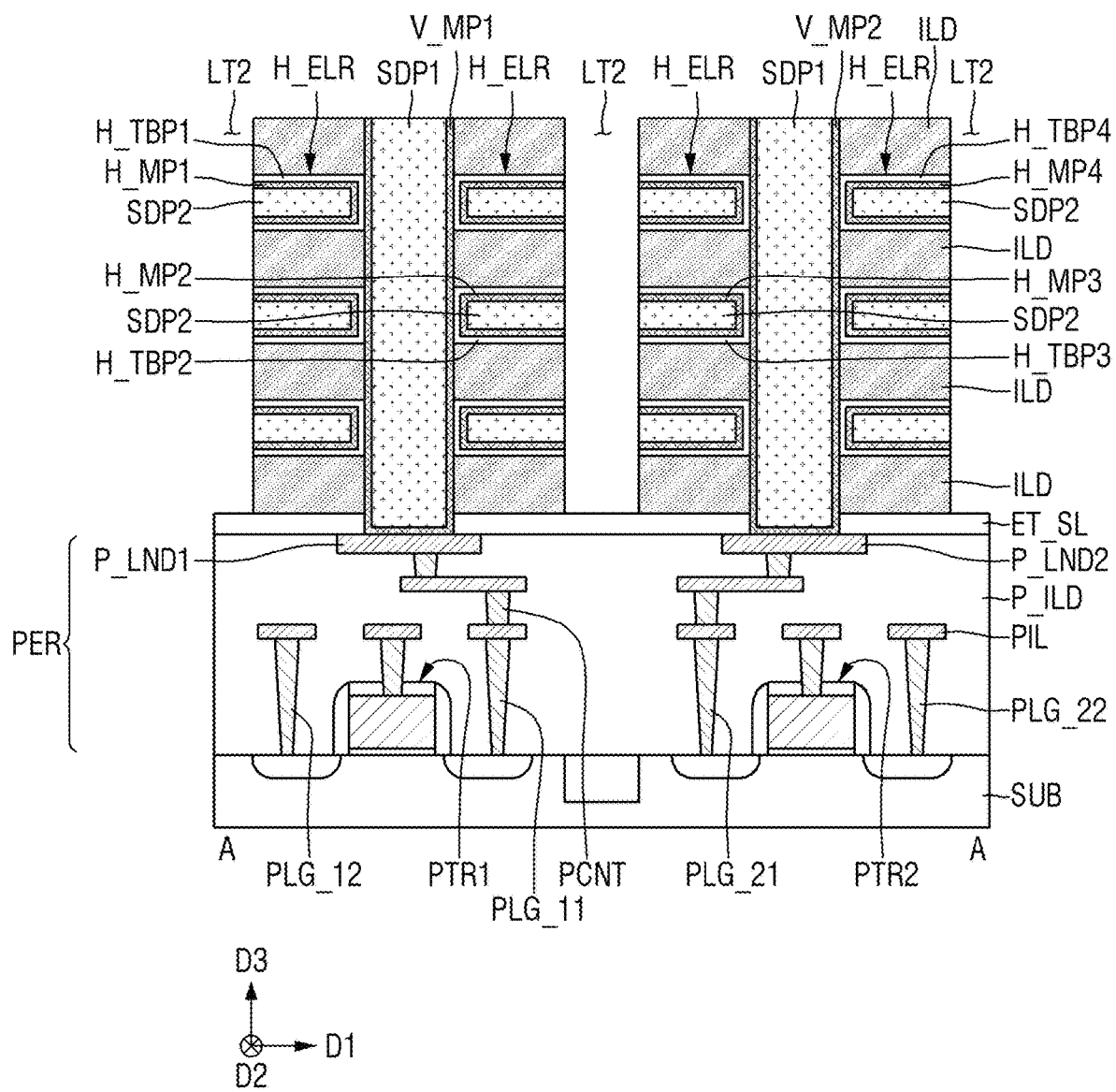

Referring to FIG. 23, the first to fourth horizontal magnetic patterns H_MP1, H_MP2, H_MP3, and H_MP4, and the first to fourth horizontal tunnel barrier patterns H_TBP1, H_TBP2, H_TBP3, and H_TBP4 may be formed along the profile of the horizontal electrode recess H_ELR.

Subsequently, the second sacrificial pattern SDP2 may fill the rest of the horizontal electrode recess H_ELR.

Referring to FIG. 5, the first sacrificial pattern SDP1 and the second sacrificial pattern SDP2 may be removed. The first to fourth horizontal conductive lines H_EL1, H_EL2, H_EL3, and H_EL4, and the first and second vertical conductive lines V_EL1 and V_EL2 may be formed in a space from which the first sacrificial pattern SDP1 and the second sacrificial pattern SDP2 are removed.

As an example, the first to fourth horizontal conductive lines H_EL1, H_EL2, H_EL3, and H_EL4, and the first and second vertical conductive lines V_EL1 and V_EL2 may be formed at the same time. As another example, the fabricating process step in which the first to fourth horizontal conductive lines H_EL1, H_EL2, H_EL3, and H_EL4 are formed may differ from the fabricating process step in which the first and second vertical conductive lines V_EL1 and V_EL2 are formed.

Unlike the configuration shown in FIG. 21, the first and second vertical tunnel barrier patterns V_TBP1 and V_TBP2 may be formed along the side walls of the first hole TH1 and the side walls of the second hole TH2, before the first vertical magnetic pattern V_MP1 and the second vertical magnetic pattern V_MP2 are formed. In such a case, in FIG. 23, only the first to fourth horizontal magnetic patterns H_MP1, H_MP2, H_MP3, and H_MP4 may be formed along the profile of the horizontal electrode recess H_ELR.

According to some example embodiments a semiconductor device may have a plurality of magnetic tunnel junction (MTJ) cells, in which vertical electrodes are connected to each other, e.g. are connected to each other above or below horizontal electrodes. There may be an improvement in electrical performance and/or in reliability.

In concluding the detailed description, those of ordinary skill in the art will appreciate that many variations and/or modifications may be made to example embodiments without substantially departing from the principles of inventive concepts. Therefore, example embodiments are used in a generic and descriptive sense only and not for purposes of limitation.

What is claimed is:

1. A semiconductor memory device comprising:
a plurality of first horizontal conductive lines on a substrate and stacked at different vertical levels in a first vertical direction, each of the plurality of first horizontal conductive lines extending in a horizontal second direction different from the first direction;
a plurality of second horizontal conductive lines on the substrate and stacked at different vertical levels in the first vertical direction, each of the plurality of second horizontal conductive lines extending in the horizontal second direction;
a vertical conductive line between each of the plurality of first horizontal conductive lines and each of plurality of second horizontal conductive lines and extending in the vertical first direction;
a plurality of first magnetic tunnel junction patterns between the vertical conductive line and respective ones of each of the plurality of first horizontal conductive lines; and
a plurality of second magnetic tunnel junction patterns between the vertical conductive line and respective ones of each of the second horizontal conductive lines,
wherein the plurality of first horizontal conductive lines and the respective plurality of second horizontal conductive lines corresponding to each other at a same vertical level are apart from each other in a horizontal third direction different the vertical first direction and the horizontal second direction.

2. The semiconductor memory device of claim 1, wherein each of the plurality of first magnetic tunnel junction patterns includes reference magnetic patterns, tunnel barrier patterns, and free magnetic patterns,
each of the free magnetic patterns is connected to each other, and
each of the reference magnetic patterns extends along upper faces of the corresponding first horizontal conductive lines, side walls of the corresponding first horizontal conductive lines, and bottom faces of the corresponding first horizontal conductive lines.

3. The semiconductor memory device of claim 2, wherein each of the tunnel barrier patterns extends along the upper faces of the corresponding first horizontal conductive lines, the side walls of the corresponding first horizontal conductive lines, and the bottom faces of the corresponding first horizontal conductive lines.

4. The semiconductor memory device of claim 2, wherein each of the tunnel barrier patterns is connected to each other.

5. The semiconductor memory device of claim 1, wherein each of the first magnetic tunnel junction patterns includes reference magnetic patterns, tunnel barrier patterns, and free magnetic patterns,
each of the reference magnetic patterns is connected to each other, and
each of the free magnetic patterns extends along upper faces of the corresponding the first horizontal conductive lines, side walls of corresponding the first horizontal conductive lines, and bottom faces of the corresponding first horizontal conductive lines.

6. The semiconductor memory device of claim 5 wherein each of the tunnel barrier patterns extends along the upper faces of the corresponding first horizontal conductive lines, the side walls of the corresponding first horizontal conductive lines, and the bottom faces of the corresponding first horizontal conductive lines.

7. The semiconductor memory device of claim 5, wherein each of the tunnel barrier patterns is connected to each other.

8. A semiconductor memory device comprising:
a plurality of first horizontal conductive lines on a substrate and stacked in a vertical first direction, each of the plurality of first horizontal conductive lines extending in a horizontal second direction different from the vertical first direction;
a plurality of second horizontal conductive lines on the substrate and stacked in the vertical first direction, each of the plurality of second horizontal conductive lines extending in the horizontal second direction;
a plurality of third horizontal conductive lines on the substrate and stacked in the vertical first direction, each of the plurality of third horizontal conductive lines extending in the horizontal second direction;
a plurality of fourth horizontal conductive lines on the substrate and stacked in the vertical first direction, each of the plurality of fourth horizontal conductive lines extending in the horizontal second direction;
a first vertical conductive line between the plurality of first horizontal conductive lines and the plurality of second horizontal conductive lines and extending in the vertical first direction;
a second vertical conductive line between the plurality of third horizontal conductive lines and the plurality of fourth horizontal conductive lines, extending in the vertical first direction, and spaced apart from the first vertical conductive line in a horizontal third direction different from the vertical first direction and the horizontal second direction;
a plurality of first magnetic tunnel junction patterns between the first vertical conductive line and the corresponding first horizontal conductive lines;
a plurality of second magnetic tunnel junction patterns between the first vertical conductive line and the corresponding second horizontal conductive lines;
a plurality of third magnetic tunnel junction patterns between the second vertical conductive line and the corresponding third horizontal conductive lines; and
a plurality of fourth magnetic tunnel junction patterns between the second vertical conductive line and the corresponding fourth horizontal conductive lines.

9. The semiconductor memory device of claim 8, wherein the first vertical conductive line and the second vertical conductive line are electrically isolated.

10. The semiconductor memory device of claim 8, further comprising:
a connection wiring connecting the first vertical conductive line with the second vertical conductive line.

11. The semiconductor memory device of claim 10, wherein the connection wiring is on the first to fourth horizontal conductive lines.

12. The semiconductor memory device of claim 11, further comprising:
a third vertical conductive line spaced apart from the first vertical conductive line in the horizontal third direction and extending in the vertical first direction,
the connection wiring connected to the third vertical conductive line.

13. The semiconductor memory device of claim 10, wherein the connection wiring is below the first to fourth horizontal conductive lines.

14. The semiconductor memory device of claim 8, wherein each of the first magnetic tunnel junction patterns includes reference magnetic patterns, tunnel barrier patterns, and free magnetic patterns,
each of the free magnetic patterns is connected to each other, and each of the tunnel barrier patterns and each of the reference magnetic patterns extend along upper faces of the corresponding first horizontal conductive lines, side walls of the corresponding first horizontal conductive lines, and bottom faces of the corresponding first horizontal conductive lines.

15. The semiconductor memory device of claim 8, wherein each of the first magnetic tunnel junction patterns includes reference magnetic patterns, tunnel barrier patterns, and free magnetic patterns, each of the reference magnetic patterns is connected to each other, and each of the free magnetic patterns and each of the tunnel barrier patterns extend along upper faces of the corresponding first horizontal conductive lines, side walls of the corresponding first horizontal conductive lines, and bottom faces of the corresponding first horizontal conductive lines.

16. A semiconductor memory device comprising:

a peripheral circuit region on a substrate; and a cell array stacked on the substrate over or under the peripheral circuit region in a vertical first direction, wherein the peripheral circuit region includes a peripheral circuit configured to control the cell array, the cell array includes, a plurality of first horizontal conductive lines stacked in the vertical first direction, each of the plurality of first horizontal conductive lines extending in a horizontal second direction different from the vertical first direction, a plurality of second horizontal conductive lines stacked in the vertical first direction, each of the plurality of second horizontal conductive lines extending in the horizontal second direction, a vertical conductive line between the plurality of first horizontal conductive lines and the plurality of second horizontal conductive lines and extending in the vertical first direction, a plurality of first magnetic tunnel junction patterns between the vertical conductive line and each of the plurality of first horizontal conductive lines, and a plurality of second magnetic tunnel junction patterns between the vertical conductive line and each of the plurality of second horizontal conductive lines, and wherein the plurality of first horizontal conductive lines and the plurality of second horizontal conductive lines that correspond to each other at a same vertical level are spaced apart from each other in a horizontal third direction different the vertical first direction and the horizontal second direction.

17. The semiconductor memory device of claim 16, wherein the peripheral circuit region further includes a connection pad connected to the peripheral circuit, and the vertical conductive line extends to the connection pad.

18. The semiconductor memory device of claim 16, wherein the peripheral circuit region further includes a first connection pad connected to the peripheral circuit, the cell array further includes a second connection pad connected to the vertical conductive line, and the first connection pad bonds to the second connection pad.

19. The semiconductor memory device of claim 16, wherein each of the first magnetic tunnel junction patterns includes reference magnetic patterns, tunnel barrier patterns, and free magnetic patterns, each of the free magnetic patterns is connected to each other, and each of the tunnel barrier patterns and each of the reference magnetic patterns extend along upper faces of the corresponding first horizontal conductive lines, side walls of the corresponding first horizontal conductive lines, and bottom faces of the corresponding first horizontal conductive lines.

20. The semiconductor memory device of claim 16, wherein each of the first magnetic tunnel junction patterns includes reference magnetic patterns, tunnel barrier patterns, and free magnetic patterns, each of the reference magnetic patterns is connected to each other, and each of the free magnetic patterns and each of the tunnel barrier patterns extend along upper faces of the corresponding first horizontal conductive lines, side walls of the corresponding first horizontal conductive lines, and bottom faces of the corresponding first horizontal conductive lines.

* * * * *